US012640483B2

(12) United States Patent
Haba et al.

(10) Patent No.: US 12,640,483 B2
(45) Date of Patent: May 26, 2026

(54) RADIO FREQUENCY DEVICE PACKAGES

(71) Applicant: ADEIA SEMICONDUCTOR TECHNOLOGIES LLC, San Jose, CA (US)

(72) Inventors: Belgacem Haba, Saratoga, CA (US); Hong Shen, Palo Alto, CA (US); Patrick Variot, Los Gatos, CA (US); Rajesh Katkar, Milpitas, CA (US)

(73) Assignee: ADEIA SEMICONDUCTOR TECHNOLOGIES LLC, San Jose, CA (US)

( * ) Notice: Subject to any disclaimer, the term of this patent is extended or adjusted under 35 U.S.C. 154(b) by 12 days.

(21) Appl. No.: 18/048,378

(22) Filed: Oct. 20, 2022

(65) Prior Publication Data

US 2023/0130259 A1 Apr. 27, 2023

Related U.S. Application Data

(60) Provisional application No. 63/343,325, filed on May 18, 2022, provisional application No. 63/271,042, filed on Oct. 22, 2021.

(51) Int. Cl.
*H01Q 9/04* (2006.01)
*H01L 23/00* (2006.01)
(Continued)

(52) U.S. Cl.
CPC .............. *H01Q 9/045* (2013.01); *H01Q 1/48* (2013.01); *H01Q 1/526* (2013.01); *H10W 42/20* (2026.01);
(Continued)

(58) Field of Classification Search
CPC .......... H01Q 9/045; H01Q 1/48; H01Q 1/526; H01L 23/49811; H01L 23/552;
(Continued)

(56) References Cited

U.S. PATENT DOCUMENTS 5,753,536 A 5/1998 Sugiyama et al.
5,771,555 A 6/1998 Eda et al.
(Continued)

FOREIGN PATENT DOCUMENTS

CN 111446175 A 7/2020
JP 2013-033786 A 2/2013
(Continued)

OTHER PUBLICATIONS

International Search Report and Written Opinion in International Application No. PCT/US2022/078431, mailed Feb. 20, 2023, 12 pages.
(Continued)

*Primary Examiner* — Hai V Tran
(74) *Attorney, Agent, or Firm* — Knobbe, Martens, Olson & Bear, LLP

(57) ABSTRACT

An integrated device package is disclosed. The integrated device package can include an antenna structure and an integrated device die electrically coupled to the antenna structure. The antenna structure can be formed with a system board or separated from the system board. When the antenna structure is formed with the system board, the integrated device package can include a redistribution layer having conductive routing traces such that the integrated device die is disposed between the system board and the redistribution layer, and the integrated device die is electrically coupled to the antenna structure at least partially through the redistribution layer. When the antenna structure is separated from the system board, the integrated device die can be positioned between the antenna structure and the system board, and the integrated device die can be electrically coupled to the antenna structure at least partially through the system board.

26 Claims, 11 Drawing Sheets

(51) Int. Cl.

| | |
|---|---|
| *H01L 23/31* | (2006.01) |
| *H01L 23/498* | (2006.01) |
| *H01L 23/552* | (2006.01) |
| *H01Q 1/48* | (2006.01) |
| *H01Q 1/52* | (2006.01) |
| *H10W 42/20* | (2026.01) |
| *H10W 74/10* | (2026.01) |
| *H10W 90/00* | (2026.01) |

(52) U.S. Cl.
CPC ........ *H10W 74/117* (2026.01); *H10W 90/701*
(2026.01); *H10W 90/734* (2026.01)

(58) Field of Classification Search
CPC ........... H01L 24/32; H01L 2224/32225; H01L
24/322; H10W 42/20; H10W 74/117;
H10W 90/701; H10W 90/734
See application file for complete search history.

(56) References Cited

U.S. PATENT DOCUMENTS

| | | | |
|---|---|---|---|
| 6,080,640 | A | 6/2000 | Gardner et al. |
| 6,423,640 | B1 | 7/2002 | Lee et al. |
| 6,465,892 | B1 | 10/2002 | Suga |
| 6,887,769 | B2 | 5/2005 | Kellar et al. |
| 6,908,027 | B2 | 6/2005 | Tolchinsky et al. |
| 7,045,453 | B2 | 5/2006 | Canaperi et al. |
| 7,105,980 | B2 | 9/2006 | Abbott et al. |
| 7,193,423 | B1 | 3/2007 | Dalton et al. |
| 7,750,488 | B2 | 7/2010 | Patti et al. |
| 7,803,693 | B2 | 9/2010 | Trezza |
| 8,183,127 | B2 | 5/2012 | Patti et al. |
| 8,349,635 | B1 | 1/2013 | Gan et al. |
| 8,377,798 | B2 | 2/2013 | Peng et al. |
| 8,441,131 | B2 | 5/2013 | Ryan |
| 8,476,165 | B2 | 7/2013 | Trickett et al. |
| 8,482,132 | B2 | 7/2013 | Yang et al. |
| 8,501,537 | B2 | 8/2013 | Sadaka et al. |
| 8,524,533 | B2 | 9/2013 | Tong et al. |
| 8,620,164 | B2 | 12/2013 | Heck et al. |
| 8,647,987 | B2 | 2/2014 | Yang et al. |
| 8,697,493 | B2 | 4/2014 | Sadaka |
| 8,716,105 | B2 | 5/2014 | Sadaka et al. |
| 8,802,538 | B1 | 8/2014 | Liu |
| 8,809,123 | B2 | 8/2014 | Liu et al. |
| 8,841,002 | B2 | 9/2014 | Tong |
| 9,093,350 | B2 | 7/2015 | Endo et al. |
| 9,142,517 | B2 | 9/2015 | Liu et al. |
| 9,171,756 | B2 | 10/2015 | Enquist et al. |
| 9,184,125 | B2 | 11/2015 | Enquist et al. |
| 9,224,704 | B2 | 12/2015 | Landru |
| 9,230,941 | B2 | 1/2016 | Chen et al. |
| 9,257,399 | B2 | 2/2016 | Kuang et al. |
| 9,299,736 | B2 | 3/2016 | Chen et al. |
| 9,312,229 | B2 | 4/2016 | Chen et al. |
| 9,331,149 | B2 | 5/2016 | Tong et al. |
| 9,337,235 | B2 | 5/2016 | Chen et al. |
| 9,385,024 | B2 | 7/2016 | Tong et al. |
| 9,394,161 | B2 | 7/2016 | Cheng et al. |
| 9,431,368 | B2 | 8/2016 | Enquist et al. |
| 9,437,572 | B2 | 9/2016 | Chen et al. |
| 9,443,796 | B2 | 9/2016 | Chou et al. |
| 9,461,007 | B2 | 10/2016 | Chun et al. |
| 9,496,239 | B1 | 11/2016 | Edelstein et al. |
| 9,536,848 | B2 | 1/2017 | England et al. |
| 9,559,081 | B1 | 1/2017 | Lai et al. |
| 9,620,481 | B2 | 4/2017 | Edelstein et al. |
| 9,656,852 | B2 | 5/2017 | Cheng et al. |
| 9,723,716 | B2 | 8/2017 | Meinhold |
| 9,728,521 | B2 | 8/2017 | Tsai et al. |
| 9,741,620 | B2 | 8/2017 | Uzoh et al. |
| 9,799,587 | B2 | 10/2017 | Fujii et al. |
| 9,852,988 | B2 | 12/2017 | Enquist et al. |
| 9,893,004 | B2 | 2/2018 | Yazdani |

| | | | | |
|---|---|---|---|---|
| 9,899,442 | B2 | 2/2018 | Katkar | |
| 9,929,050 | B2 | 3/2018 | Lin | |
| 9,941,241 | B2 | 4/2018 | Edelstein et al. | |
| 9,941,243 | B2 | 4/2018 | Kim et al. | |
| 9,953,941 | B2 | 4/2018 | Enquist | |
| 9,960,142 | B2 | 5/2018 | Chen et al. | |
| 10,002,844 | B1 | 6/2018 | Wang et al. | |
| 10,026,605 | B2 | 7/2018 | Doub et al. | |
| 10,075,657 | B2 | 9/2018 | Fahim et al. | |
| 10,115,712 | B2 * | 10/2018 | Hu | H01Q 21/065 |
| 10,204,893 | B2 | 2/2019 | Uzoh et al. | |
| 10,269,756 | B2 | 4/2019 | Uzoh | |
| 10,276,619 | B2 | 4/2019 | Kao et al. | |
| 10,276,909 | B2 | 4/2019 | Huang et al. | |
| 10,418,277 | B2 | 9/2019 | Cheng et al. | |
| 10,446,456 | B2 | 10/2019 | Shen et al. | |
| 10,446,487 | B2 | 10/2019 | Huang et al. | |
| 10,446,532 | B2 | 10/2019 | Uzoh et al. | |
| 10,483,617 | B2 * | 11/2019 | Chuang | H01L 24/19 |
| 10,508,030 | B2 | 12/2019 | Katkar et al. | |
| 10,522,499 | B2 | 12/2019 | Enquist et al. | |
| 10,707,087 | B2 | 7/2020 | Uzoh et al. | |
| 10,784,191 | B2 | 9/2020 | Huang et al. | |
| 10,790,262 | B2 | 9/2020 | Uzoh et al. | |
| 10,840,135 | B2 | 11/2020 | Uzoh | |
| 10,840,205 | B2 | 11/2020 | Fountain, Jr. et al. | |
| 10,854,578 | B2 | 12/2020 | Morein | |
| 10,879,212 | B2 | 12/2020 | Uzoh et al. | |
| 10,886,177 | B2 | 1/2021 | DeLaCruz et al. | |
| 10,892,246 | B2 | 1/2021 | Uzoh | |
| 10,923,408 | B2 | 2/2021 | Huang et al. | |
| 10,923,413 | B2 | 2/2021 | DeLaCruz | |
| 10,950,547 | B2 | 3/2021 | Mohammed et al. | |
| 10,964,664 | B2 | 3/2021 | Mandalapu et al. | |
| 10,985,133 | B2 | 4/2021 | Uzoh | |
| 10,991,804 | B2 | 4/2021 | DeLaCruz et al. | |
| 10,998,292 | B2 | 5/2021 | Lee et al. | |
| 11,004,757 | B2 | 5/2021 | Katkar et al. | |
| 11,011,494 | B2 | 5/2021 | Gao et al. | |
| 11,011,503 | B2 | 5/2021 | Wang et al. | |
| 11,031,285 | B2 | 6/2021 | Katkar et al. | |
| 11,037,919 | B2 | 6/2021 | Uzoh et al. | |
| 11,056,348 | B2 | 7/2021 | Theil | |
| 11,069,734 | B2 | 7/2021 | Katkar | |
| 11,088,099 | B2 | 8/2021 | Katkar et al. | |
| 11,127,738 | B2 | 9/2021 | DeLaCruz et al. | |
| 11,158,573 | B2 | 10/2021 | Uzoh et al. | |
| 11,158,606 | B2 | 10/2021 | Gao et al. | |
| 11,169,326 | B2 | 11/2021 | Huang et al. | |
| 11,171,117 | B2 | 11/2021 | Gao et al. | |
| 11,176,450 | B2 | 11/2021 | Teig et al. | |
| 11,195,748 | B2 | 12/2021 | Uzoh et al. | |
| 11,205,625 | B2 | 12/2021 | DeLaCruz et al. | |
| 11,244,920 | B2 | 2/2022 | Uzoh | |
| 11,256,004 | B2 | 2/2022 | Haba et al. | |
| 11,264,357 | B1 | 3/2022 | DeLaCruz et al. | |
| 11,276,676 | B2 | 3/2022 | Enquist et al. | |
| 11,296,044 | B2 | 4/2022 | Gao et al. | |
| 11,296,053 | B2 | 4/2022 | Uzoh et al. | |
| 11,329,034 | B2 | 5/2022 | Tao et al. | |
| 11,348,898 | B2 | 5/2022 | DeLaCruz et al. | |
| 11,355,404 | B2 | 6/2022 | Gao et al. | |
| 11,355,443 | B2 | 6/2022 | Huang et al. | |
| 11,367,652 | B2 | 6/2022 | Uzoh et al. | |
| 11,373,963 | B2 | 6/2022 | DeLaCruz et al. | |
| 11,380,597 | B2 | 7/2022 | Katkar et al. | |
| 11,385,278 | B2 | 7/2022 | DeLaCruz et al. | |
| 11,387,202 | B2 | 7/2022 | Haba et al. | |
| 11,387,214 | B2 | 7/2022 | Wang et al. | |
| 11,393,779 | B2 | 7/2022 | Gao et al. | |
| 11,462,419 | B2 | 10/2022 | Haba | |
| 11,476,213 | B2 | 10/2022 | Haba et al. | |
| 11,515,291 | B2 | 11/2022 | DeLaCruz et al. | |
| 2004/0084414 | A1 | 5/2004 | Sakai et al. | |
| 2006/0057945 | A1 | 3/2006 | Hsu et al. | |
| 2007/0111386 | A1 | 5/2007 | Kim et al. | |
| 2013/0292808 | A1 | 11/2013 | Yen et al. | |
| 2014/0175655 | A1 | 6/2014 | Chen et al. | |
| 2015/0064498 | A1 | 3/2015 | Tong | |

(56) References Cited

U.S. PATENT DOCUMENTS

| | | | |
|---|---|---|---|
| 2016/0343682 A1 | 11/2016 | Kawasaki | |
| 2017/0040266 A1* | 2/2017 | Lin | H01L 23/5389 |
| 2017/0117231 A1 | 4/2017 | Awujoola et al. | |
| 2017/0236776 A1 | 8/2017 | Huynh et al. | |
| 2018/0159203 A1* | 6/2018 | Baks | H01Q 9/045 |
| 2018/0175012 A1 | 6/2018 | Wu et al. | |
| 2018/0182639 A1 | 6/2018 | Uzoh et al. | |
| 2018/0182666 A1 | 6/2018 | Uzoh et al. | |
| 2018/0190580 A1 | 7/2018 | Haba et al. | |
| 2018/0190583 A1 | 7/2018 | DeLaCruz et al. | |
| 2018/0219038 A1 | 8/2018 | Gambino et al. | |
| 2018/0323177 A1 | 11/2018 | Yu et al. | |
| 2018/0323227 A1 | 11/2018 | Zhang et al. | |
| 2018/0331066 A1 | 11/2018 | Uzoh et al. | |
| 2019/0115277 A1 | 4/2019 | Yu et al. | |
| 2019/0131277 A1 | 5/2019 | Yang et al. | |
| 2019/0207304 A1* | 7/2019 | Kim | H01L 24/25 |
| 2019/0385935 A1 | 12/2019 | Gao et al. | |
| 2020/0013765 A1 | 1/2020 | Fountain, Jr. et al. | |
| 2020/0035641 A1 | 1/2020 | Fountain, Jr. et al. | |
| 2020/0075513 A1 | 3/2020 | Wieland et al. | |
| 2020/0176416 A1* | 6/2020 | Ketterson | H01L 24/20 |
| 2020/0294908 A1 | 9/2020 | Haba et al. | |
| 2020/0328162 A1 | 10/2020 | Haba et al. | |
| 2020/0395321 A1 | 12/2020 | Katkar et al. | |
| 2021/0098412 A1 | 4/2021 | Haba et al. | |
| 2021/0118864 A1 | 4/2021 | DeLaCruz et al. | |
| 2021/0143125 A1 | 5/2021 | DeLaCruz et al. | |
| 2021/0181510 A1 | 6/2021 | Katkar et al. | |
| 2021/0193603 A1 | 6/2021 | DeLaCruz et al. | |
| 2021/0193624 A1 | 6/2021 | DeLaCruz et al. | |
| 2021/0193625 A1 | 6/2021 | Katkar et al. | |
| 2021/0242152 A1 | 8/2021 | Fountain, Jr. et al. | |
| 2021/0257716 A1 | 8/2021 | Baheti et al. | |
| 2021/0272931 A1* | 9/2021 | Patil | H01L 23/5389 |
| 2021/0296282 A1 | 9/2021 | Gao et al. | |
| 2021/0305202 A1 | 9/2021 | Uzoh et al. | |
| 2021/0366820 A1 | 11/2021 | Uzoh | |
| 2021/0407941 A1 | 12/2021 | Haba | |
| 2022/0077063 A1 | 3/2022 | Haba | |
| 2022/0077087 A1 | 3/2022 | Haba | |
| 2022/0139867 A1 | 5/2022 | Uzoh | |
| 2022/0139869 A1 | 5/2022 | Gao et al. | |
| 2022/0208650 A1 | 6/2022 | Gao et al. | |
| 2022/0208702 A1 | 6/2022 | Uzoh | |
| 2022/0208723 A1 | 6/2022 | Katkar et al. | |
| 2022/0246497 A1 | 8/2022 | Fountain, Jr. et al. | |
| 2022/0285303 A1 | 9/2022 | Mirkarimi et al. | |
| 2022/0319901 A1 | 10/2022 | Suwito et al. | |
| 2022/0320035 A1 | 10/2022 | Uzoh et al. | |
| 2022/0320036 A1 | 10/2022 | Gao et al. | |
| 2023/0005850 A1 | 1/2023 | Fountain, Jr. | |
| 2023/0019869 A1 | 1/2023 | Mirkarimi et al. | |
| 2023/0036441 A1 | 2/2023 | Haba et al. | |
| 2023/0067677 A1 | 3/2023 | Lee et al. | |
| 2023/0069183 A1 | 3/2023 | Haba | |
| 2023/0100032 A1 | 3/2023 | Haba et al. | |
| 2023/0115122 A1 | 4/2023 | Uzoh et al. | |
| 2023/0122531 A1 | 4/2023 | Uzoh | |
| 2023/0123423 A1 | 4/2023 | Gao et al. | |
| 2023/0125395 A1 | 4/2023 | Gao et al. | |
| 2023/0132632 A1 | 5/2023 | Katkar et al. | |
| 2023/0140107 A1 | 5/2023 | Uzoh et al. | |
| 2023/0142680 A1 | 5/2023 | Guevara et al. | |
| 2023/0154816 A1 | 5/2023 | Haba et al. | |
| 2023/0154828 A1 | 5/2023 | Haba et al. | |
| 2023/0187264 A1 | 6/2023 | Uzoh et al. | |
| 2023/0187317 A1 | 6/2023 | Uzoh | |
| 2023/0187412 A1 | 6/2023 | Gao et al. | |
| 2023/0197453 A1 | 6/2023 | Fountain, Jr. et al. | |
| 2023/0197496 A1 | 6/2023 | Theil | |
| 2023/0197559 A1 | 6/2023 | Haba et al. | |
| 2023/0197560 A1 | 6/2023 | Katkar et al. | |
| 2023/0197655 A1 | 6/2023 | Theil et al. | |
| 2023/0207402 A1 | 6/2023 | Fountain, Jr. et al. | |
| 2023/0207437 A1 | 6/2023 | Haba | |
| 2023/0207474 A1 | 6/2023 | Uzoh et al. | |
| 2023/0207514 A1 | 6/2023 | Gao et al. | |
| 2023/0215836 A1 | 7/2023 | Haba et al. | |
| 2023/0245950 A1 | 8/2023 | Haba et al. | |
| 2023/0268300 A1 | 8/2023 | Uzoh et al. | |
| 2023/0299029 A1 | 9/2023 | Theil et al. | |
| 2023/0343734 A1 | 10/2023 | Uzoh et al. | |
| 2023/0360950 A1 | 11/2023 | Gao | |
| 2023/0361074 A1 | 11/2023 | Uzoh et al. | |
| 2023/0369136 A1 | 11/2023 | Uzoh et al. | |
| 2023/0375613 A1 | 11/2023 | Haba et al. | |
| 2024/0038702 A1 | 2/2024 | Uzoh | |
| 2024/0055407 A1 | 2/2024 | Workman | |
| 2024/0079376 A1 | 3/2024 | Suwito et al. | |
| 2024/0105674 A1 | 3/2024 | Uzoh et al. | |
| 2024/0170411 A1 | 5/2024 | Chang et al. | |
| 2024/0186248 A1 | 6/2024 | Haba et al. | |
| 2024/0186268 A1 | 6/2024 | Uzoh et al. | |
| 2024/0186269 A1 | 6/2024 | Haba | |
| 2024/0203917 A1 | 6/2024 | Katkar et al. | |
| 2024/0213191 A1 | 6/2024 | Theil et al. | |
| 2024/0213210 A1 | 6/2024 | Haba et al. | |
| 2024/0217210 A1 | 7/2024 | Zhao et al. | |
| 2024/0222239 A1 | 7/2024 | Gao et al. | |
| 2024/0222315 A1 | 7/2024 | Uzoh | |
| 2024/0222319 A1 | 7/2024 | Gao et al. | |
| 2024/0266255 A1 | 8/2024 | Haba et al. | |
| 2024/0298454 A1 | 9/2024 | Haba | |
| 2024/0304593 A1 | 9/2024 | Uzoh | |
| 2024/0312951 A1 | 9/2024 | Theil et al. | |
| 2024/0332184 A1 | 10/2024 | Katkar et al. | |
| 2024/0332227 A1 | 10/2024 | Uzoh et al. | |
| 2024/0332231 A1 | 10/2024 | Uzoh | |
| 2024/0332267 A1 | 10/2024 | Haba et al. | |
| 2024/0387419 A1 | 11/2024 | Mrozek et al. | |
| 2025/0004197 A1 | 1/2025 | Haba et al. | |
| 2025/0006632 A1 | 1/2025 | Chang et al. | |
| 2025/0006642 A1 | 1/2025 | Haba et al. | |
| 2025/0006674 A1 | 1/2025 | Uzoh et al. | |
| 2025/0006679 A1 | 1/2025 | Theil et al. | |
| 2025/0006689 A1 | 1/2025 | Uzoh et al. | |

FOREIGN PATENT DOCUMENTS

| | | |
|---|---|---|
| JP | 2018-160519 | 10/2018 |
| WO | WO 2005/043584 A2 | 5/2005 |

OTHER PUBLICATIONS

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Moriceau, H. et al., "Overview of recent direct wafer bonding advances and applications," Advances in Natural Sciences—Nanoscience and Nanotechnology, 2010, 11 pages.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1 (I), 6 pages.

Plobi, A. et al., "Wafer direct bonding: tailoring adhesion between brittle materials," Materials Science and Engineering Review Journal, 1999, R25, 88 pages.

Bush, Steve, "Electronica: Automotive power modules from On Semi," ElectronicsWeekly.com, indicating an Onsemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

(56)                References Cited

OTHER PUBLICATIONS

Onsemi AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part number "Onsemi AR0820.".

Sony IMX260 images, showing various cross sections and materials analyses for a hybrid bonded back side illuminated CMOS image sensor. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image." (8 pages).

European Extended Search Report dated Aug. 7, 2025 for Application No. 22884691.1, 13 pages.

* cited by examiner

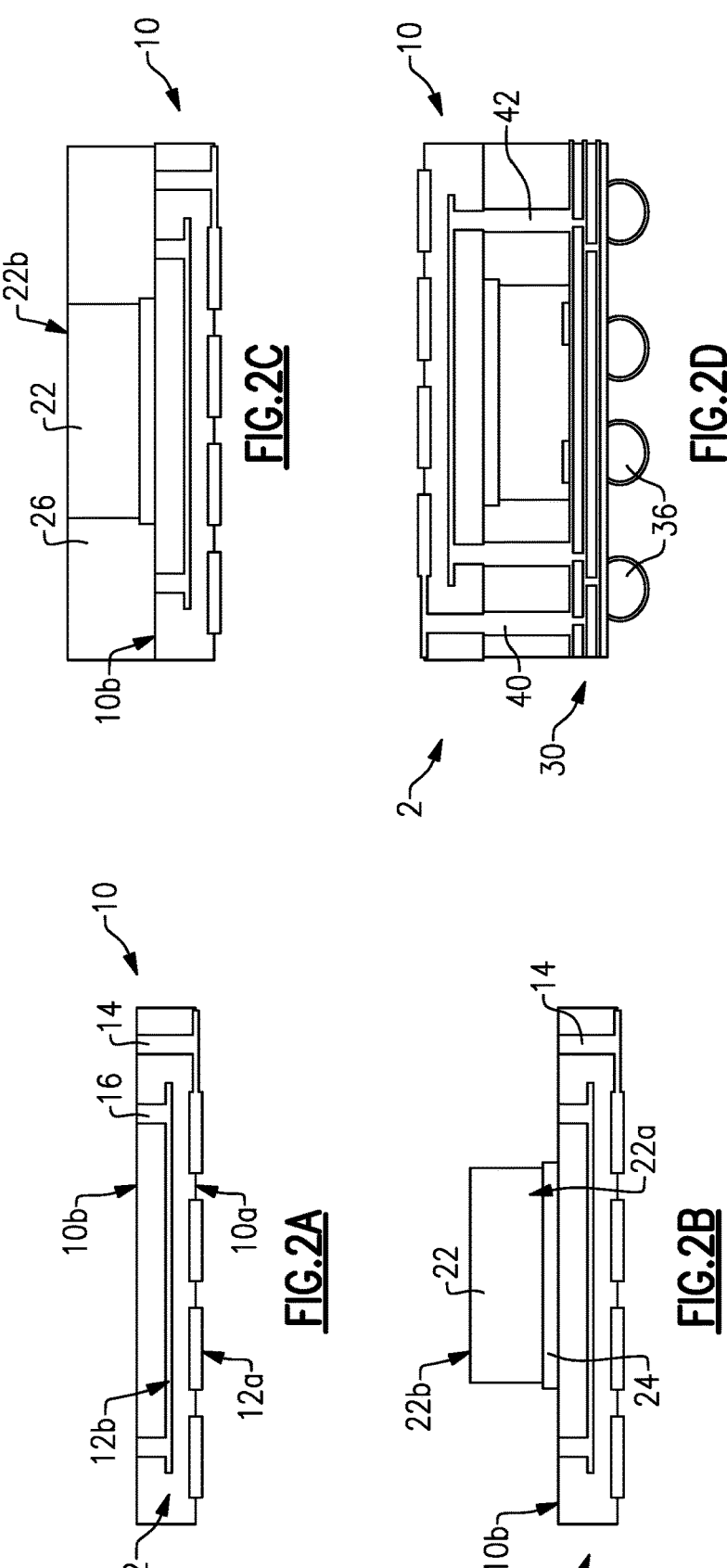

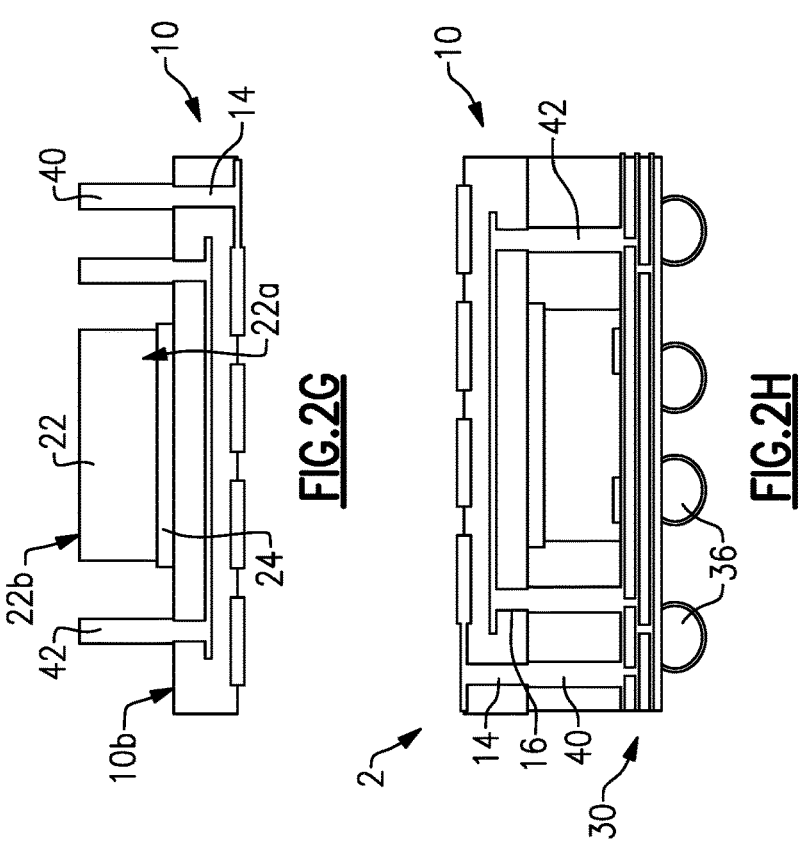
FIG.2G
FIG.2H
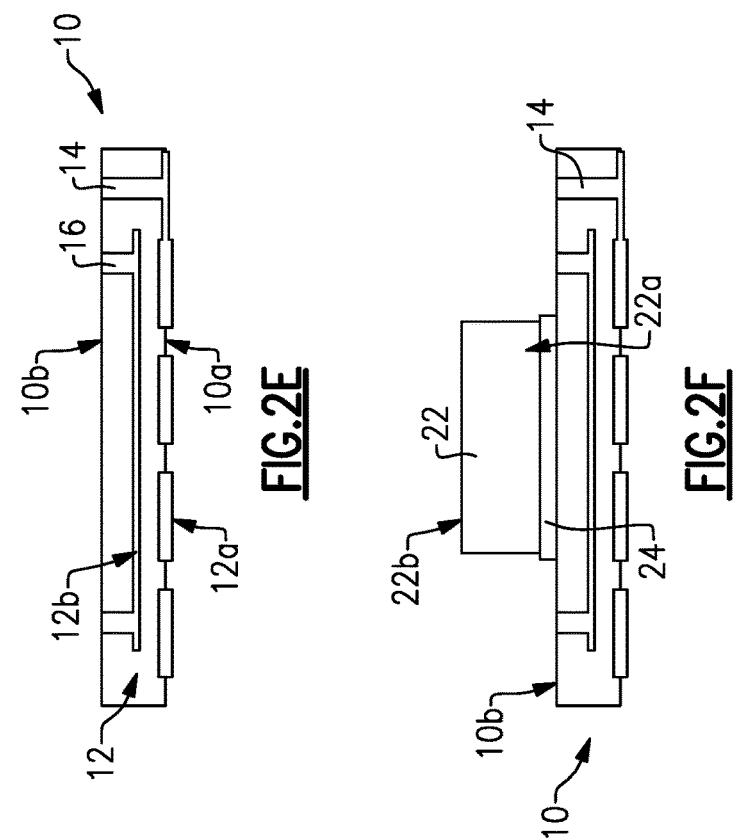
FIG.2E
FIG.2F

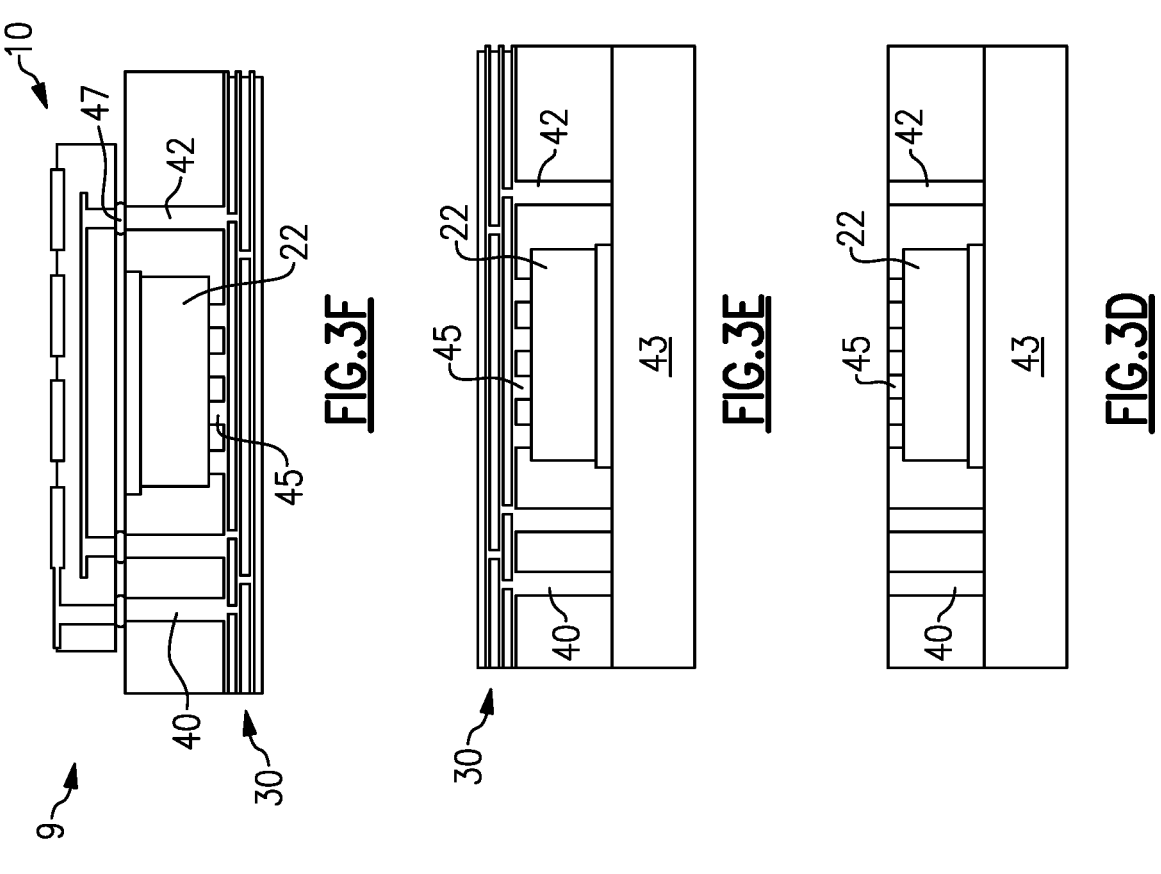
FIG.3F
FIG.3E
FIG.3D
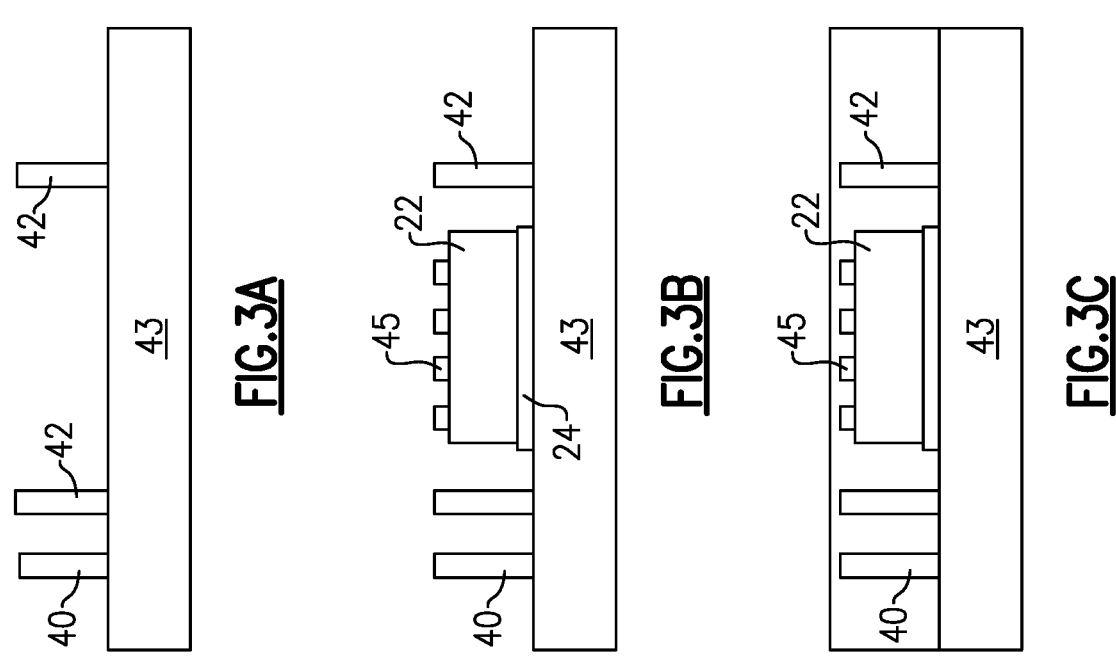
FIG.3A
FIG.3B
FIG.3C

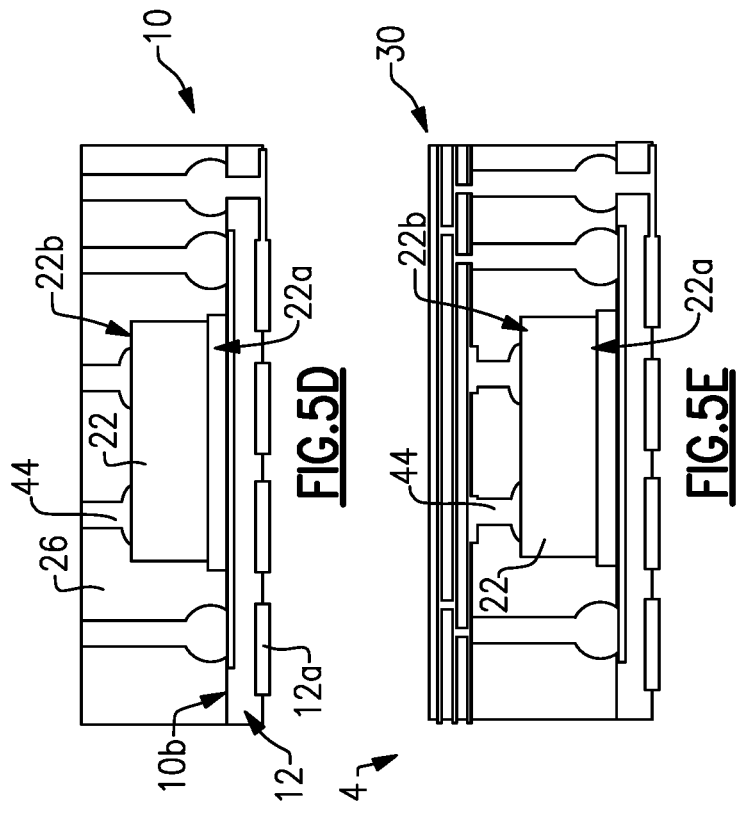
FIG.5D
FIG.5E
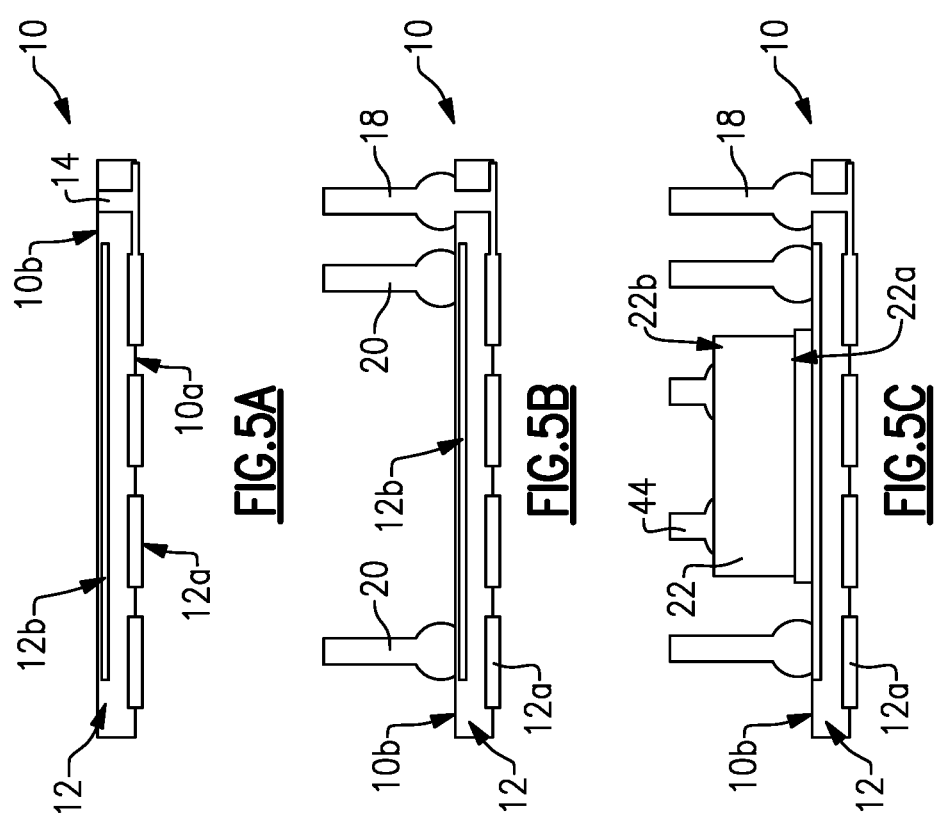
FIG.5A
FIG.5B
FIG.5C

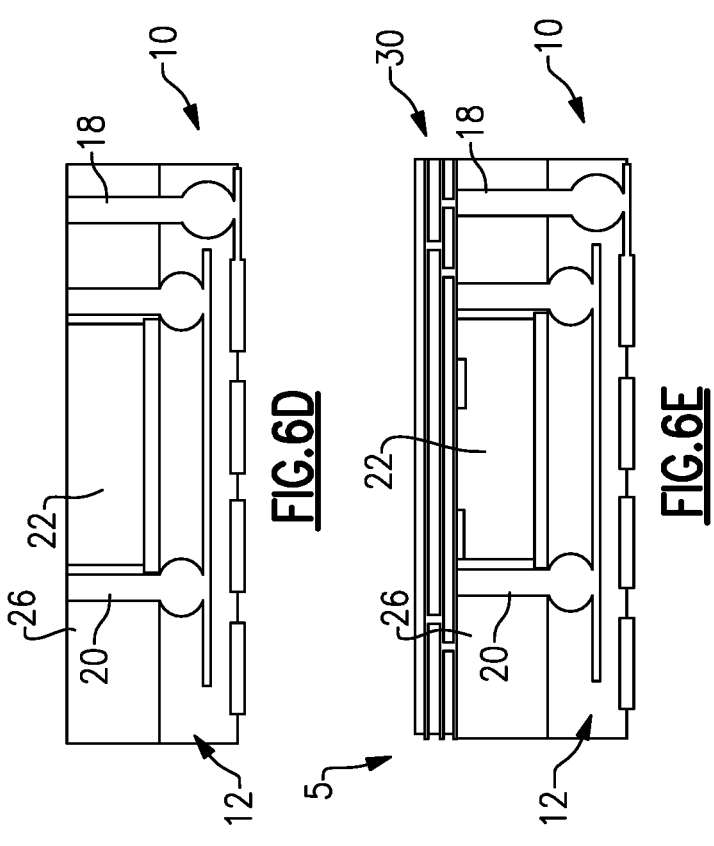
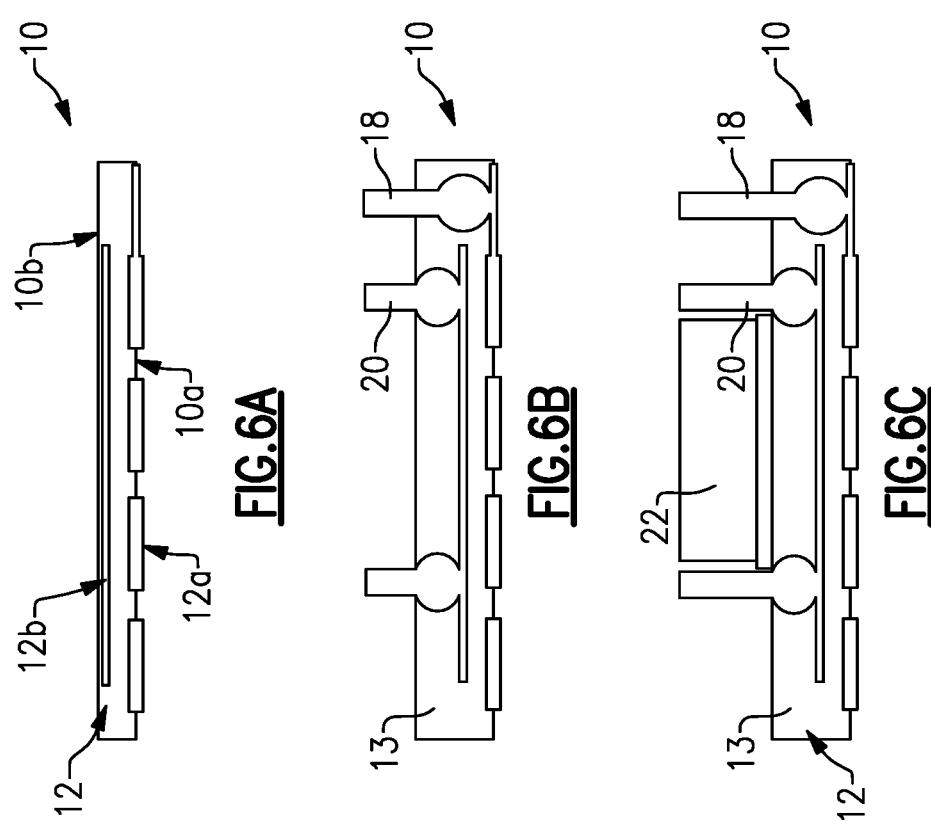

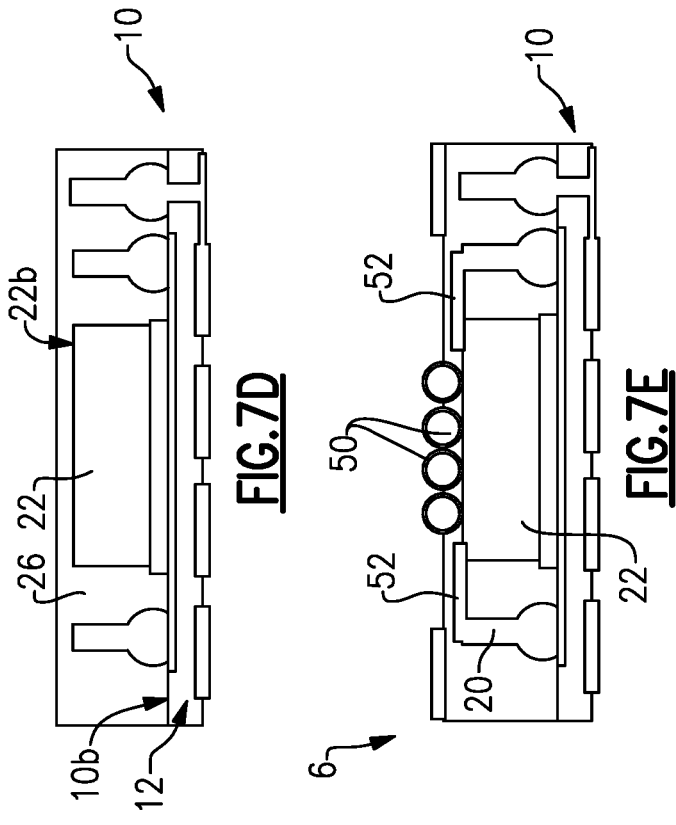
FIG.7D
FIG.7E
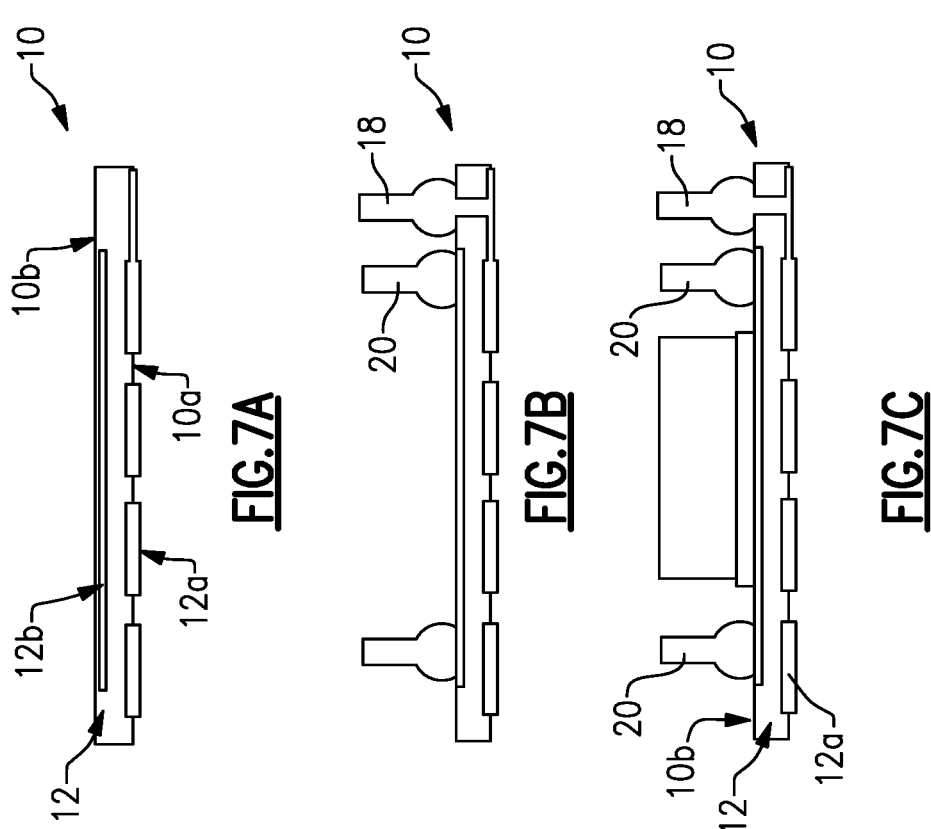
FIG.7A
FIG.7B
FIG.7C

RADIO FREQUENCY DEVICE PACKAGES

CROSS-REFERENCE TO RELATED APPLICATIONS

This application claims priority to U.S. Provisional Patent Application No. 63/271,042, filed Oct. 22, 2021, titled "RADIO FREQUENCY DEVICE PACKAGES," and U.S. Provisional Patent Application No. 63/343,325, filed May 18, 2022, titled "RADIO FREQUENCY DEVICE PACK-AGES," the entire contents of each of which are hereby incorporated herein by reference.

BACKGROUND

Field

The field generally relates to integrated device packages, and in particular, to radio frequency (RF) packages.

Description of the Related Art

High performance radio frequency (RF) devices are in high demand today. The performance of an RF device can be based on, for example, its gain, bandwidth, directivity, etc. The RF device can include an antenna structure and a die (e.g., radio frequency integrated circuit (RFIC), transceiver die, etc.). The manner in which the antenna structure and the die are packaged can affect the performance of the RF device. Efficiently designed Antenna in Package (AiP) or Antenna on Package (AoP) structures may simplify the module complexities while providing a performance boost for the evolving wireless technology landscape. It can be difficult to manufacture high performance RF devices that are compact and reliable. Accordingly, there remains a continuing need for improved RF device packages.

BRIEF DESCRIPTION OF THE DRAWINGS

The detailed description is set forth with reference to the accompanying figures. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternatively, other implementations of devices and/or systems may include additional components, or various combinations of the described components, and remain within the scope of the disclosure.

FIGS. 2A-2D show steps in a method of manufacturing an integrated device package, according to another embodiment.

FIGS. 2E-2H show steps in a method of manufacturing an integrated device package, according to another embodiment.

FIGS. 3A-3F show steps in a method of manufacturing an integrated device package, according to another embodiment.

FIGS. 5A-5E show steps in a method of manufacturing an integrated device package, according to another embodiment.

FIGS. 6A-6E show steps in a method of manufacturing an integrated device package, according to another embodiment.

FIGS. 7A-7E show steps in a method of manufacturing an integrated device package, according to another embodiment.

DETAILED DESCRIPTION

Figures 1A, 1B, 1C, 1D, 1E, 1F:
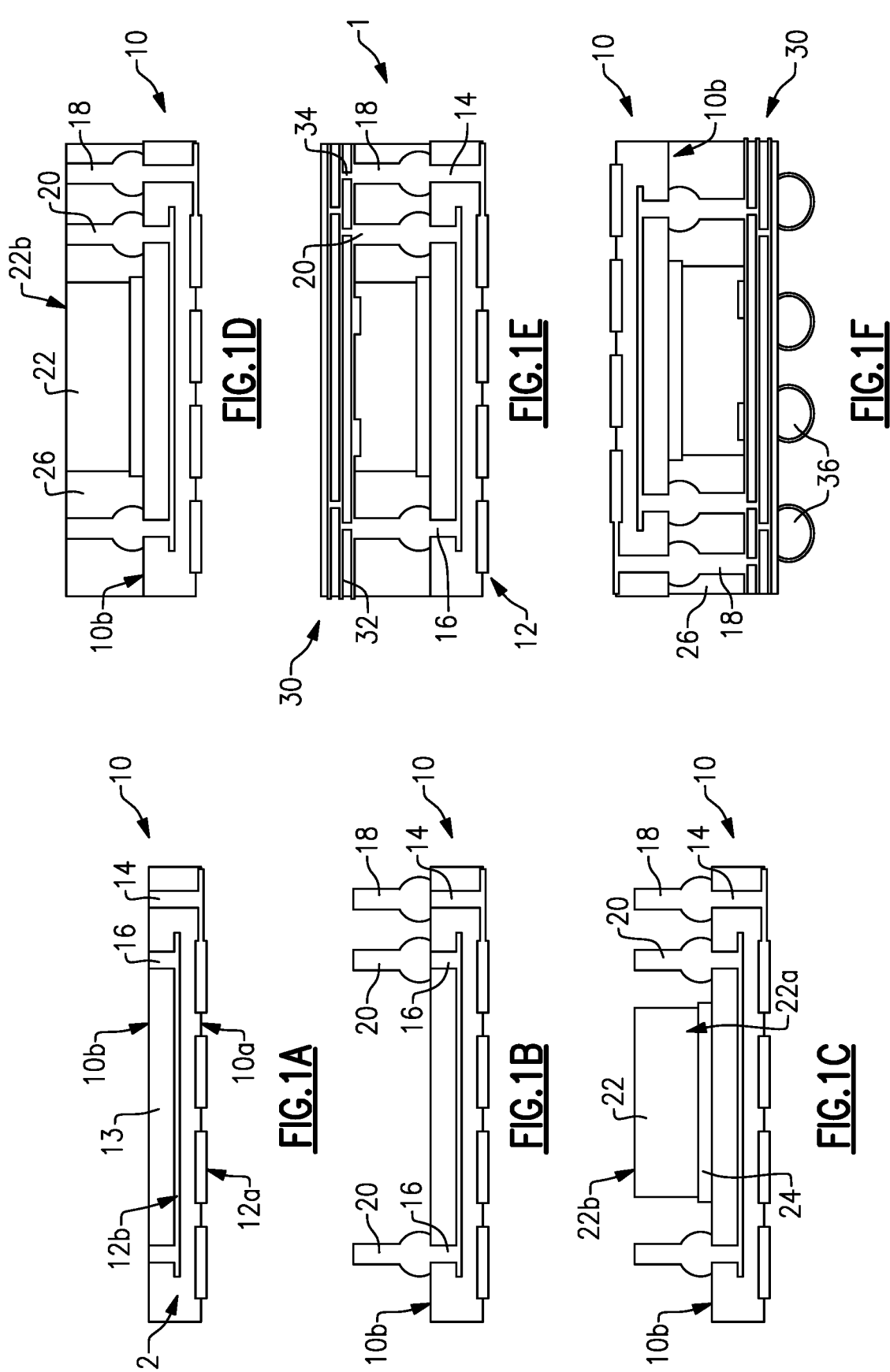
FIGS. 1A-1F show steps in a method of manufacturing an integrated device package, according to one embodiment.
Figures 4A, 4B, 4C, 4D, 4E:
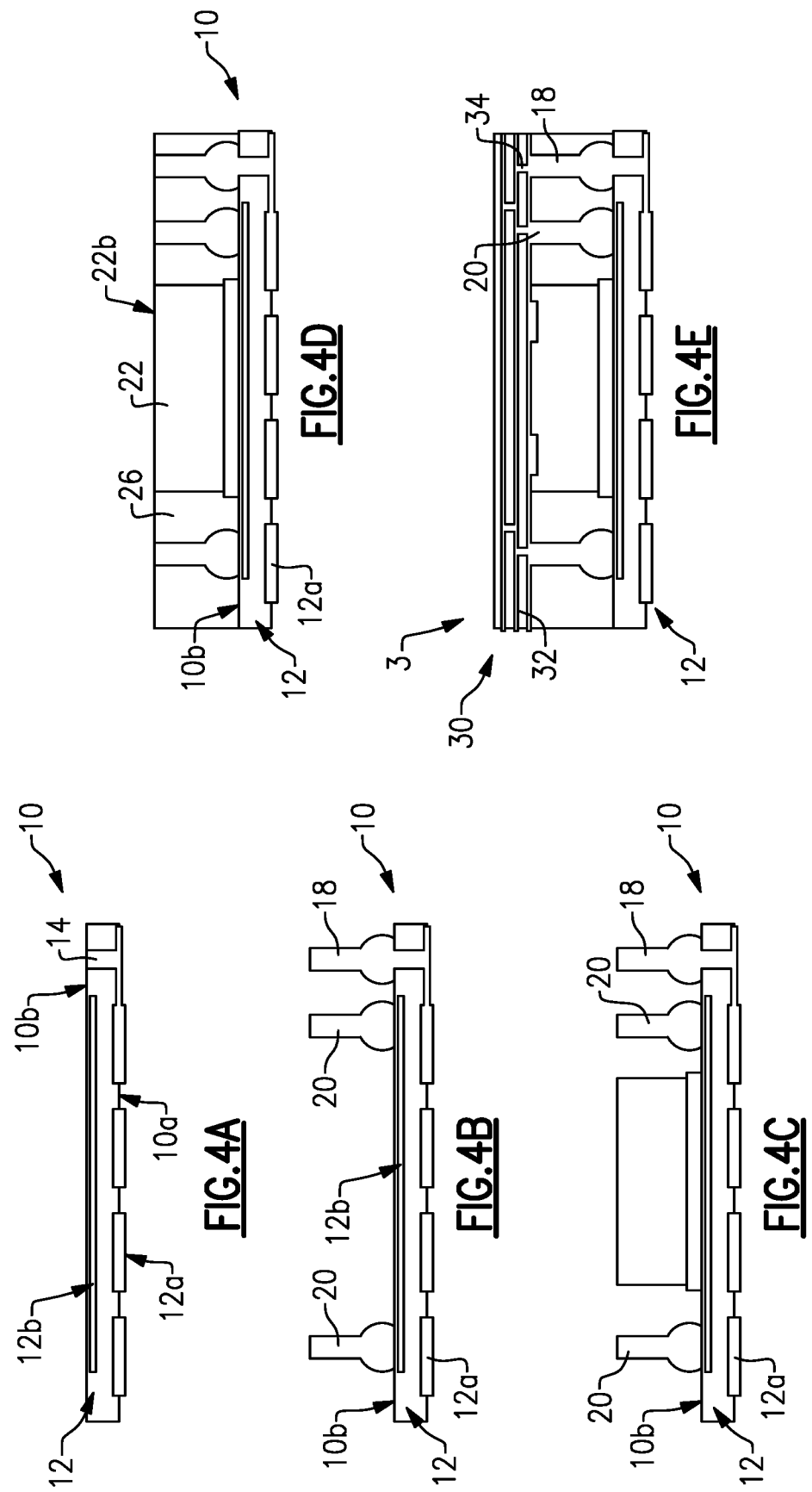
FIGS. 4A-4E show steps in a method of manufacturing an integrated device package, according to another embodiment.

In various technologies such as wireless communications technologies, communication frequency has been increasing and likely will continue to increase. For example, in a typical cellular network, frequencies can be on the order of at least a few GHz. With new standards (e.g., a 5G standard), frequencies can be substantially higher, for example, at least 25 GHz, at least 50 GHz, at least 75 GHz, at least 94 GHz, at least 160 GHz, at least 300 GHz etc. Unlike systems compatible with a 4G standard, systems (e.g., millimeter wave (mmWave) systems) compatible with the 5G standard incorporate phased-array antennas, which include an array of antennas with individual radiating elements. A phased-array antenna can electrically steer a beam in multiple directions using beamforming techniques.

An antenna structure can be placed on a board that is separate from a radio frequency integrated circuit (RFIC) chipset. This approach is known as a discrete antenna approach. An antenna structure and the RFIC can also be integrated into a single package. Such integrated structure can be referred as an antenna-in-package (AiP). The AiP can make the distance between the antenna structure and the RFIC closer, which can contribute to improving transmitter efficiency and receiver noise as compared to the discrete antenna approach. The RFIC chipset may include transceiver ICs, power amplifier (PA), low-noise amplifier (LNA), switch, etc.

A connection between an RF system-in-package (SiP), such as the RFIC, and the antenna structure in the AiP, preferably has a relatively low insertion loss and good impedance matching, while the antenna structure placement may be controlled for improved radiation performance. There are tradeoffs in designing the AiP. For example, electrical performance, thermomechanical reliability, compactness, manufacturability, and cost can be affected by a choice of the design of the AiP.

Various embodiments disclosed herein relate to an integrated device package that includes an antenna structure and an integrated device die (e.g., radio frequency integrated circuit (RFIC)) chipset coupled to the antenna structure. Various embodiments disclosed herein can enable a distance between the antenna structure and the die to be relatively short, thereby improving a transmitter efficiency and/or a receiver noise figure. The integrated device die can be mounted on a carrier such as a printed circuit board (PCB). In some embodiments, the antenna structure can be formed with a redistribution layer that is coupled to the carrier. The redistribution layer and the carrier can be electrically connected through an interconnect structure. The interconnect structure can comprise a standing bond wire, such as an array of standing bond wires (e.g., a bond via array (BVA®)) or a conductive post, such as an array of conductive post. The BVA can comprise an array of bond wires that extend from conductive portions of the carrier. Connecting the element to the redistribution layer through the BVA can beneficially enable the integrated device package to improve its performance while reducing its manufacturing cost. The BVA can be structured so as to provide a shielding function. For example, the BVA can be formed with a pitch narrower than an operating frequency of the antenna structure to shield the integrated device die from the radio frequency having the operating frequency. Additional example BVA structures and implementations may be found throughout U.S. Pat. No. 10,559,537, the entire contents of which are incorporated by reference herein in their entirety and for all purposes. The interconnected structure can comprise a electroplated conductive post or pillar. The interconnect structure can be formed using any other suitable technique.

In some other embodiments, the antenna structure can be formed with an element or a carrier, such as a system board (e.g., a printed circuit board (PCB)). The integrated device package can include a redistribution layer (RDL) that is coupled to the element. The element and the RDL can be connected through an interconnect structure (e.g., the BVA).

FIGS. 1A to 1F show various steps in a method of manufacturing an integrated device package 1. FIG. 1A is a schematic cross sectional side view of an element 10 having an antenna structure 12. The element 10 can comprise a system board such as a printed circuit board (PCB). In the illustrated embodiment, the laminate system board can serve as a package substrate for the package 1. The PCB can comprise an FR-4 board that includes conductive traces embedded in a reinforced epoxy laminate sheet reinforced, for example, by glass. The PCB can comprise a polytetrafluoroethylene (PTFE) PCB, a prepreg, a ceramic PCB, a polyimide PCB, or any other materials that may be implemented to manufacture a PCB. The antenna structure 12 can comprise one or more radiating elements 12a and an antenna ground 12b. The antenna structure 12 can comprise metallization layers formed in and/or on an insulating material 13. As illustrated in FIG. 1A, the radiating element 12a can be disposed on a first side 10a of the element 10, and the antenna ground 12b can be at least partially embedded in the insulating material 13 of the element 10. For example, the antenna ground 12b can be completely embedded in the insulating material 13, and the radiating element 12a can be partially embedded in the insulating material 13 and exposed on the first side 10a. The antenna structure 12 can comprise a patch antenna, a grid antenna, Yagi-Uda, or any other type of antenna structure. The element 10 can include vias 14, 16. The via 14 can be connected to the one or more radiating elements 12a and extend at least partially though a thickness of the element 10 (e.g., completely through the insulating material 13) from the second side 10a. The vias 16 can be connected to the radiating element 12b and extend at least partially though a thickness of the element 10 (e.g., partially through the insulating material 13) from the second side 10a. Although the radiating elements 12a are shown in only one metal layer of the PCB or substrate in FIG. 1A, the radiating elements 12a may be formed on two or more metal layers. An air pocket or cavity may be disposed between the radiating element 12a and the antenna ground 12b to help improve bandwidth and radiation efficiency and suppress the surface waves.

FIG. 1B is a schematic cross sectional side view of the element 10 and conductive wires 18, 20. The conductive wires 18, 20 are an example of an interconnect structure. The conductive wires 18, 20 can define a bond via array (BVA). The conductive wire 18 can be connected to the via 14 by way of a wire bonding process, and the conductive wires 20 can be connected to the vias 16 by way of a wire bonding process. The conductive wires 18, 20 can extend generally vertically in a direction generally perpendicular to the second side 10b of the element 10. Although the conductive wires 18, 20 are shown to be directly connected to the vias 16 and 14 in FIG. 1B, in some other instances, the conductive wires 18, 20 may be connected using one or more metal layers or conductive wiring in the PCB. In some other embodiments, the conductive wires 18, 20 can comprise conductive posts or conductive pillar. The conductive wires 18, 20 can be formed by way of via electroplating or any other suitable post or pillar formation techniques.

One or more passive devices (e.g., capacitors, inductors) may be formed or embedded (e.g. integrated passive devices or IPDs) in other areas of the PCB. In another example, one or more microelectronic devices, e.g., a voltage regulator or any other integrated circuit die, may also be embedded in the PCB.

FIG. 1C is a schematic cross sectional side view of the element 10 and an integrated device die 22 mounted to the second side 10b of the element 10. The integrated device die 22 can be a radio frequency (RF) die that includes RF circuitry. For example, the integrated device die 22 can comprise a radio frequency integrated circuit (RFIC), or a monolithic microwave IC (MMIC). The integrated device die 22 has a first side 22a and a second side 22b opposite the first side, and the first side 22a can be mounted to the element 10 by way of a die attach material 24. Operation frequency of the RF die can be, for example, at least 1 GHz, at least 5 GHz, at least 10 GHz, at least 25 GHz, at least 50 GHz, at least 75 GHz, at least 94 GHz, at least 160 GHz, at least 300 GHz etc. Additional electronic elements (not shown) can be mounted to the second side 10b of the element 10.

FIG. 1D is a schematic cross sectional side view of the element 10 and the integrated device die 22 embedded in a molding material 26. The molding material 26 can be applied about the integrated device die 22 and the conductive wires 18, 20 and onto the element 10. The second side 22b of the integrated device die 22 can be embedded in the molding material 26 as shown in FIG. 1D. In other embodiments, however, the second side 22b of the integrated device die 22 can be exposed through the molding compound 26 by polishing or otherwise removing portions of the molding material 26 that overlie the die 22. For example, a surface of the molding material 26 and the second side 22b of the integrated device die 22 can be generally flush with one another. In other embodiments, the second side 22 of the die 22 can be embedded in the molding material 26, and holes can be formed through the overlying portions of molding material 26 to provide electrical communication to bond pads of the die 22. A plate (not shown) can be provided over the second side 22*b* of the integrated device die 22, and the molding material 26 can be flowed between the plate and the element 10, such that the molding material 26 underfills spaces or gaps between the plate and the element 10. The molding material 26 can be deposited and a portion of the molding material 26 over the second side 22*b* of the integrated device die 22 can be removed (e.g., polished).

In another example, conductive posts or pads (not shown) can be formed on the second side 22*b* of the integrated device die 22 and ends of conductive posts and conductive wires 18 and 20 can extend above the second side 22*b* of the integrated device die 22. The molding material 26 can be deposited around and over the conductive posts, the conductive wires 18, 20, and the integrated die 22, and a portion of the molding material 26 can be removed (e.g., polished) to expose the ends of the conductive wires 18, 20 and the conductive posts on the integrated device die 22, while second surface 22*b* is still under the molding material 26.

FIG. 1E is a schematic cross sectional side view of the integrated device package 1 that includes the element 10, the integrated device die 22, and a redistribution layer (RDL) 30. The RDL 30 can comprise conductive traces 32 that extend laterally and conductive vias 34 that extend vertically within the RDL 30. The RDL 30 can be electrically connected to the conductive wires 18 20, and the integrated device die 22. In another example, conductive posts (not shown) can be formed on the integrated device die 22, and the integrated device die 22 and the RDL 30 can be electrically connected through the conductive posts on the integrated device die 22. The antenna structure 12 of the element 10 can be electrically coupled with the integrated device die 22 through the vias 14, 16, the conductive wires 18, 20, laterally through conductive traces of the RDL 30, and vertically through the conductive posts or pads formed on the integrated device die 22. The orientation of the antenna structure 12, the integrated device die 22, and the RDL 30 can enable relatively short electrical path between the antenna structure 12 and the integrated device die 22. Using the conductive wires 18, 20 for electrically connecting the structure 12 and the RDL 30 can enable a relatively low cost manufacture of the integrated device package 1, especially considering the relatively low number of such conductive wires 18, 20 used to make the electrical connections between the antenna structure 12 and the RDL 30. Forming the antenna structure 12 on a substrate or board such as a PCB, instead of forming the antenna structure 12 with additional RDL layers, can improve the manufacturability and reduce the manufacturing cost.

As described above, the BVA can be structured so as to provide a shielding (e.g., electromagnetic shielding) function. For example, the BVA can be formed with a pitch narrower than an operating frequency of the antenna structure to shield the integrated device die from the radio frequency having the operating frequency. For example, the pitch of the BVA can be at least 150-200 microns. In some examples, the antenna ground 12*b* of the antenna structure 12 may be part of the shield. In some other examples, a separate ground layer may be provided to form a shield. In some examples, the BVA can be formed so as to shield one area within the integrated device package 1 from another area within the integrated device package 1. For example, one area of the integrated device package 1 can have the integrated device die 22 and the other area of the integrated device package 1 can include an electronic component (e.g., an integrated device die).

At FIG. 1F, solder balls 36 can be provided on a surface of the RDL 30 for an input/output (I/O) connection. The integrated device package 1 can be mounted on a larger system or device through the solder balls 36. For example, the integrated device package 1 can be implemented in a motherboard of a device such as a cellular phone device.

FIGS. 2A to 2D show various steps in a method of manufacturing an integrated device package 2. Unless otherwise noted, the components of FIGS. 2A to 2D may be the same as or generally similar to like components of FIGS. 1A to 1F.

FIG. 2A is a schematic cross sectional side view of an element 10 having an antenna structure 12. The element 10 can comprise a system board such as a printed circuit board (PCB). In the illustrated embodiment, the laminate system board can serve as a package substrate for the package 1. The antenna structure 12 can comprise a radiating element 12*a* (e.g., a patch antenna) and an antenna ground 12*b*. As illustrated in FIG. 2A, the radiating element 12*a* can be disposed on a first side 10*a* of the element 10, and the antenna ground 12*b* can be at least partially embedded in the element 10. The element 10 can include vias 14, 16. The via 14 can be connected to the radiating element 12*a* and extend at least partially though a thickness of the element 10 from the second side 10*a*. The vias 16 can be connected to the antenna ground 12*b* and extend at least partially though a thickness of the element 10 from the second side 10*a*.

FIG. 2B is a schematic cross sectional side view of the element 10 and an integrated device die 22 mounted to the second side 10*b* of the element 10. The integrated device die 22 can be a radio frequency (RF) die that includes RF circuitry. For example, the integrated device die 22 can comprise a radio frequency integrated circuit (RFIC), or a monolithic microwave IC (MMIC). The integrated device die 22 has a first side 22*a* and a second side 22*b* opposite the first side, and the first side 22*a* can be mounted to the element 10 by way of a die attach material 24.

FIG. 2C is a schematic cross sectional side view of the element 10 and the integrated device die 22 embedded in a molding material 26. The molding material 26 can be applied about the integrated device die 22. The second side 22*b* of the integrated device die 22 can be embedded in the molding material 26. The second side 22*b* of the integrated device die 22 can be exposed, for example, by way of a polishing or other material removal process to remove portions of the molding compound 26 that overlies the die 22. For example, a surface of the molding material 26 and the second side 22*b* of the integrated device die 22 can be generally flush with one another. In other embodiments, the second side 22 of the die 22 can be embedded in the molding material 26, and holes can be formed through the overlying portions of molding material 26 to provide electrical communication to bond pads of the die 22.

FIG. 2D is a schematic cross sectional side view of the integrated device package 2. At FIG. 2D, conductive posts 40, 42 are formed. The conductive posts 40, 42 can be formed by drilling through mold vias in the molding material 26 and filling the vias with a conductive material. In some other examples, the conductive posts 40, 42 can be formed before mounting the integrated device die 22 on the second side 10*b* of the element 10 or providing the molding material 26. Also, at FIG. 2D, an RDL 30 can be provided. The conductive posts 40, 42 can be similar to the conductive wires 18, 20 functionally. The RDL 30 can comprise conductive traces 32 that extend laterally and conductive vias 34 that extend vertically within the RDL 30. The RDL 30 can be electrically connected to the conductive wires 28, 20, and the integrated device die 22. The antenna structure 12 of the element 10 can be electrically coupled with the integrated device die 22 through the vials 14, 16, the conductive wires 18, 20, and through the RDL 30. The orientation of the antenna structure 12, the integrated device die 22, and the RDL 30 can enable a relatively short electrical path between the antenna structure 12 and the integrated device die 22. Using the conductive wires 18, 20 for electrically connecting the structure 12 and the RDL 30 can enable a relatively low cost manufacture of the integrated device package 1. Also, at FIG. 2D, solder balls 36 can be provided on a surface of the RDL 30 for an input/output (I/O) connection. The integrated device package 1 can be mounted on a larger system or device through the solder balls 36. For example, the integrated device package 1 can be implemented in a motherboard of a device such as cellular phone device.

FIGS. 2E to 2H show various steps in another method of manufacturing the integrated device package 2. Unless otherwise noted, the components of FIGS. 2E to 2H may be the same as or generally similar to like components of FIGS. 1A to 2D. The manufacturing process shown in FIGS. 2E to 2H are generally similar to the manufacturing process shown in FIGS. 2A to 2D, except that the conductive posts 40, 42 in the manufacturing process of FIGS. 2E to 2H are formed prior to providing the molding material 26.

FIGS. 3A to 3F show various steps in another method of manufacturing an integrated device package 9. Unless otherwise noted, the components of FIGS. 3A to 3F may be the same as or generally similar to like components of FIGS. 1A to 2H. In FIG. 3A, conductive posts 40, 42 can be formed on a carrier 43. The conductive posts 40, 42 can comprise plated posts, and/or BVA. In some embodiments, a resist layer can be patterned and pillars can be electroplated to form the conductive posts 40, 42. In FIG. 3B, an integrated device die 22 can be mounted on the carrier 43. The integrated device die 22 can be attached to the carrier 43 by way of a die attach material 24. The integrated device die 22 can comprise posts 45. In some embodiments, the integrated device die 22 can omit the posts 45 and terminals (not shown) can be exposed for electrical connection. In FIG. 3C, a molding material 26 can be provided. In FIG. 3D, at least a portion of the molding material 26 can be removed to reveal the conductive posts 40, 42 and the posts 45. In FIG. 3E, an RDL 30 can be provided and electrically connected with the conductive posts 40, 42 and the posts 45. In FIG. 3F, the carrier 43 can be removed and an element 10 can be provided and electrically connected with the conductive posts 40, 42. In some embodiments, the element 10 can be electrically connected to the conductive posts 40, 42 by way of, for example, a ball grid array (BGA) 47.

FIGS. 4A to 4E show various steps in a method of manufacturing an integrated device package 3. Unless otherwise noted, the components of FIGS. 4A to 4E may be the same as or generally similar to like components of FIGS. 1A to 3F. The integrated device package 3 is generally similar to the integrated device package 1 illustrated in FIGS. 1E and 1F, except that the antenna ground 12b of the integrated device package 3 is formed at (e.g., exposed at) the second side 10b of the element 10. The integrated device package can omit the via 16 that is shown in some other embodiments disclosed herein. In FIGS. 4A-4E, the antenna ground 12b can also serve as an electrical ground connection for the die 22 in some embodiments.

FIGS. 5A to 5E show various steps in a method of manufacturing an integrated device package 4. Unless otherwise noted, the components of FIGS. 5A to 5E may be the same as or generally similar to like components of FIGS. 1A to 4E. The integrated device package 4 is generally similar to the integrated device package 3 illustrated in FIG. 4E, except that the integrated device die 22 of the integrated device package 4 is electrically connected to the RDL 30 by way of conductive wires 44 that extend at least partially though a thickness of the molding material 26 between pads on the upper surface of the die 22 and the RDL 30. In some embodiments, the conductive wires 44 can be formed at the same time or after conductive wires 20 and 18 are formed. In some other embodiments, the conductive wires 44 can be replaced with conductive posts or conductive bumps.

FIGS. 6A to 6E show various steps in a method of manufacturing an integrated device package 5. Unless otherwise noted, the components of FIGS. 6A to 6E may be the same as or generally similar to like components of FIGS. 1A to 5E. The integrated device package 5 is generally similar to the integrated device package 1 illustrated in FIGS. 1E and 1F, except that the vias 14, 16 are omitted from the integrated device package 3 and the conductive wires 18, 20 are directly in contact with the antenna structure 12. As shown in FIGS. 6B-6E, for example, end portions of the wires 18, 20 can be embedded in the insulating material 13. Conductive wires 18, 20 can be formed on pads that are exposed for the conductive wires to enable wire bond. In some embodiments, portions of the conductive wires 18, 20 can be covered by the insulating material 13. In some other embodiments, for example, openings can be formed in the insulating material 13, and the wires 18, 20 can be connected within the openings to the antenna structure 12.

FIGS. 7A to 7E show various steps in a method of manufacturing an integrated device package 6. Unless otherwise noted, the components of FIGS. 7A to 7E may be the same as or generally similar to like components of FIGS. 1A to 6E. The integrated device package 6 is generally similar to the integrated device package 3 illustrated in FIG. 4E. Unlike the integrated device package 3, the integrated device package 6 of FIGS. 7A-7E does not include the RDL 30. The integrated device package 6 can include solder balls 50 for an input/output (I/O) connection to an external device or external motherboard. The integrated device package 6 can include a horizontal interconnect 52. The horizontal interconnect 52 can connect the conductive wires 20 to the integrated device die 22. The horizontal interconnect 52 can function as a radiation shield in various embodiments.

Figure 8:
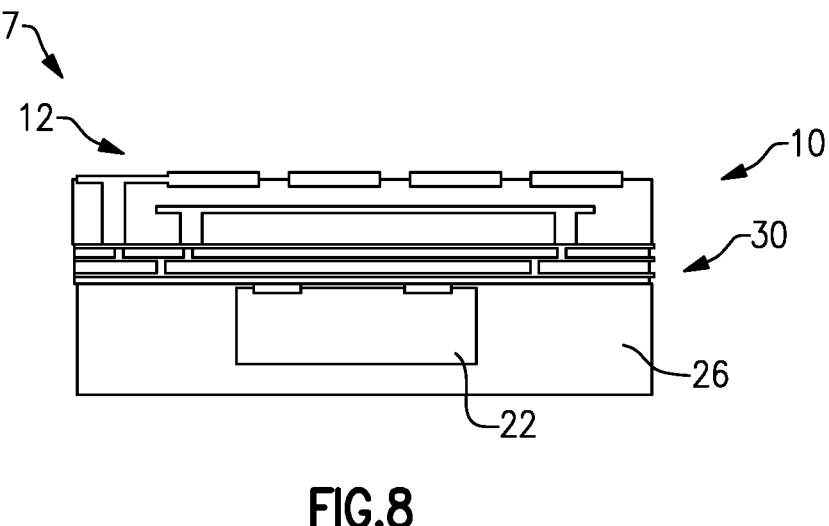
FIG. 8 is a schematic cross sectional side view of an integrated device package according to an embodiment.

FIG. 8 is a schematic cross sectional side view of an integrated device package 7 according to an embodiment. Unless otherwise noted, the components of FIG. 8 may be the same as or generally similar to like components of FIGS. 1A to 7E. The integrated device package 7 can include an element 10 that includes an antenna structure 12, a redistribution layer (RDL) 30, and an integrated device die 22. The integrated device due 22 can be embedded in a molding material 26. In the illustrated embodiment shown in FIG. 8, the antenna structure 12 of the element 10 and the RDL 30 are on the same side of the integrated device die 22.

FIGS. 9A-9G show integrated device packages 7, 7', 8, 8', 8" according to various embodiments. Any suitable principles and advantages discussed herein can be implemented and/or applied to the integrated device packages 7, 7', 8, 8', 8". For example, any processes and/or combinations of processes disclosed herein can be applied to forming at least a portion of the integrated device packages 7, 7', 8, 8', 8".

Figures 9A, 9B, 9C, 9D:
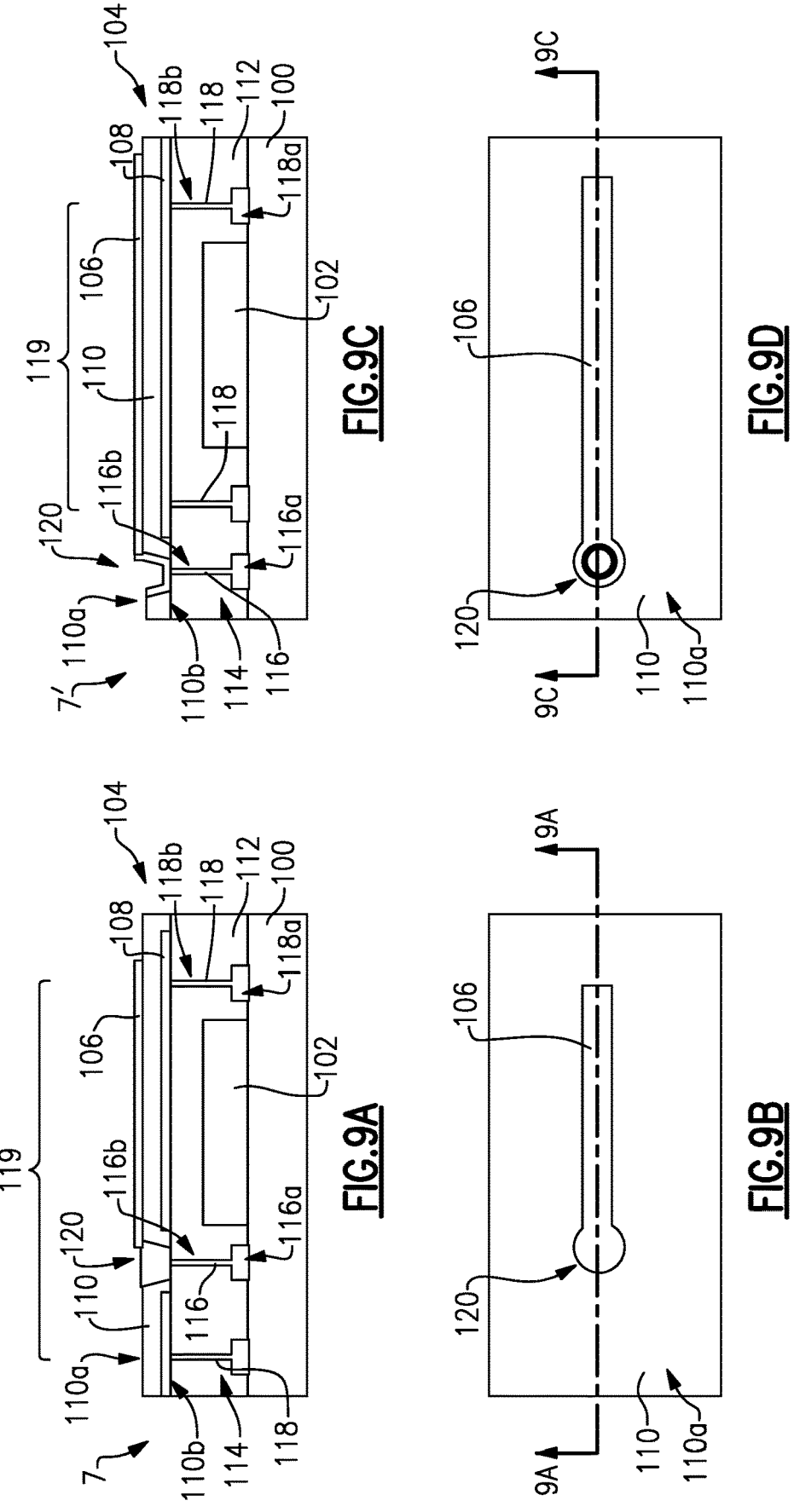
FIG. 9A is a schematic cross sectional side view of the integrated device package 7 according to an embodiment.
FIG. 9B is a schematic top plan view of the integrated device package of FIG. 9A.
FIG. 9C is a schematic cross sectional side view of the integrated device package according to another embodiment.
FIG. 9D is a schematic top plan view of the integrated device package of FIG. 9C.

FIG. 9A is a cross sectional side view of the integrated device package 7 according to an embodiment. FIG. 9B is a top plan view of the integrated device package 7. The integrated device package 7 can include a carrier 100, an integrated device die 102 mounted on the carrier 100, an antenna structure 104 that includes a radiating element 106 and an antenna ground 108, an electromagnetic compatible (EMC) layer 110, and a molding material 112 disposed between the carrier 100 and the EMC layer 110. The EMC layer 110 can comprise an RDL material. In some embodiments, two or more antenna structures (not shown) can be included in the integrated device package 7. For example, the two or more antenna structures can be formed on, in, or with the EMC layer 110. The RDL material can comprise a material such as, for example, polyimide (PI), polybenzoxazoles (PBO), etc., and be spin coated, laminated, or printed on the molding material 112. The antenna structure 104 can be electrically connected to the carrier 100 through an interconnect structure 114. The interconnect structure 114 can include conductive wires 116, 118. The conductive wires 116, 118 can define a bond via array (BVA), and can extend upwardly through the molding material from the carrier 100. For example, the carrier 100 and the radiating element 106 can be electrically connected through the conductive wire 116, and the carrier 100 and the antenna ground 108 can be electrically connected through the conductive wire 118. The conductive wire 118 can comprise a ground wire and provide ground connection to the antenna ground 108. In some embodiments, the conductive wire 116 that connects the radiating element 106 and the carrier 100 can be positioned laterally between the conductive wires 118 that connects the antenna ground 108 and the carrier 100, as shown in FIG. 9A. In such embodiments, the conductive wire 116 can be positioned in a shielded region 119. As shown, the die 102 can also be positioned within the shielded region 119, which can be at least partially defined by the ground wires 118 that are disposed about a periphery of the die 102. In some other embodiments, the conductive wire 116 can be positioned laterally outside of the conductive wires 118, as shown in FIG. 9B. In such embodiments, the conductive wire 116 can be positioned outside the shielded region 119.

The carrier 100 can comprise any suitable type of carrier or substrate in various embodiments. In some embodiments, the carrier 100 can comprise a system board such as a printed circuit board (PCB), which can serve as a package substrate for the package 7. The PCB can comprise an FR-4 board that includes conductive traces embedded in a reinforced epoxy laminate sheet reinforced, for example, by glass. The PCB can comprise a polytetrafluoroethylene (PTFE) PCB, a prepreg, a ceramic PCB, a polyimide PCB, or any other materials traditionally implemented to manufacture a PCB. In other embodiments, the carrier 100 can comprise a ceramic substrate, an interposer, or any suitable substrate or support. In some embodiments, the carrier can include conductive traces that extend laterally to provide electrical communication between the die 102 and the wires 116, 118.

The integrated device die 102 can be a radio frequency (RF) die that includes RF circuitry. For example, the integrated device die 102 can comprise a radio frequency integrated circuit (RFIC), or a monolithic microwave IC (MMIC). In some embodiments, the integrated device die 102 can be flip-chip mounted on the carrier 100. For example, the integrated device die 102 can be mounted on the carrier 100 by way of solder balls. In other embodiments, the integrated device die 102 can be wire bonded to the carrier 100. In such embodiments, a die attach material may be disposed between the carrier 100 and the integrated device die 102.

The antenna structure 104 can comprise one or more radiating elements 106 and an antenna ground 108. The antenna structure 104 can comprise a patch antenna, a grid antenna, Yagi-Uda, or any other type of antenna structure. In some embodiments, the antenna structure 104 can be formed with the EMC layer 110. For example, the radiating element 106 can be formed on a portion of an upper side 110*a* (e.g., an upper surface) of the EMC layer 110, and the antenna ground 108 can be formed on a portion of a lower side 110*b* (e.g., a lower surface) of the EMC layer 110.

In some embodiments, the EMC layer 110 can comprise a redistribution layer (RDL). The EMC layer 110 can comprise a via 120 that can extend at least partially through a thickness of the EMC layer 110. The via 120 can be provided in an opening formed in the EMC layer 110. The via 120 can comprise a filled via as shown in FIG. 9A, or a conformal via as shown in FIG. 9B. The via 120 can provide an electrical connection between the conductive wire 116 and the radiating element 106.

In some embodiments, the molding material 112 can comprise an electromagnetic compatible material. In some embodiments, the molding material 112 and the EMC layer 110 can comprise the same material. The integrated device die 102 and the conductive wires 116, 118 can be embedded in the molding material 112.

In some embodiments, the conductive wire 116, 118 can comprise a first portion 116*a*, 118*a* in contact with the carrier 100 and a second portion 116*b*, 118*b* extending non-parallel to (e.g., generally perpendicular to) a surface of the carrier 100 to which the integrated device die 102 is mounted. In some embodiments, the interconnect structure 114 can comprise a bond via array (BVA). In such embodiments, the first portion 116*a*, 118*a* can include a width wider than a width of the second portion 116*b*, 118*b* indicative of a wire bond via formation process. For example, the first portion 116*a*, 118*a* and the second portion 116*b*, 118*b* can form a continuous, seamless, or uniform structure. In some embodiments, the BVA can be arranged to shield the integrated device die 102 from electromagnetic radiation. For example, the BVA can be formed around a periphery of the die 102 with a pitch between adjacent wires narrower than an operating frequency of the antenna structure 104 so as to shield the integrated device die 102 from the radio frequency having the operating frequency. In some embodiments, the BVA is not deposited (e.g., electroplated) as conformal layers over a portion of the package 7 such as the carrier 100 or the molding material 112. Rather, the BVA is formed by a wire bonding process.

FIG. 9C is a cross sectional side view of the integrated device package 7' according to an embodiment. FIG. 9D is a top plan view of the integrated device package 7'. Unless otherwise noted, the components of FIGS. 9C and 9D may be the same as or generally similar to like components of FIGS. 9A and 9B. Unlike the integrated device package 7 of FIGS. 9A and 9B, the via 120 in the integrated device package 7' of FIGS. 9C and 9D comprises a conformal via. Also, in the integrated device package 7' of FIG. 9C, locations of the conductive wires 116, 118 of the interconnect structure 114, as well as locations of the corresponding conductive wires 116, 118, are different from those shown in FIG. 9A. In some embodiments, the locations of the conductive wires 116, 118 in FIG. 9C provide different shielding properties for the integrated device die 102 than the conductive wires 116, 118 in FIG. 9A. The wire 116 can feed signals to the radiating element 106 from the integrated device die 102. The wires 118 can provide ground connection to the antenna ground 108.

Figure 9E:
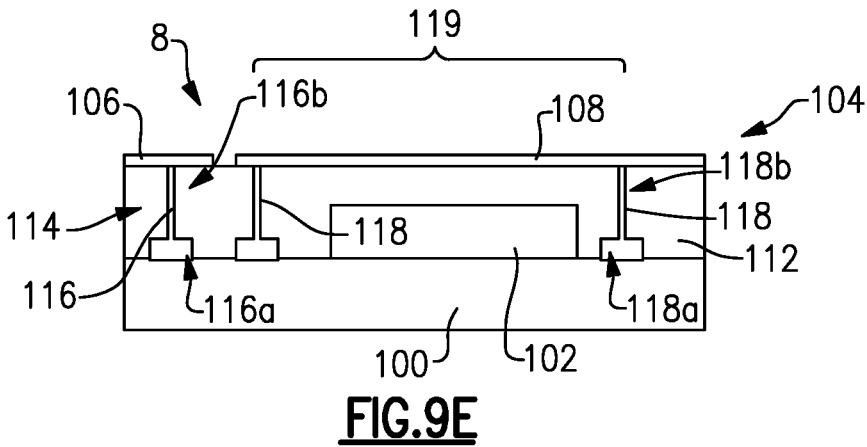
FIG. 9E is a schematic cross sectional side view of the integrated device package according to another embodiment.

FIG. 9E is a cross sectional side view of the integrated device package 8 according to an embodiment. Unless otherwise noted, the components of FIG. 9C may be the same as or generally similar to like components of FIGS. 9A to 9D. In the integrated device package 8 of FIG. 9E, the antenna structure 104 can be formed on the molding material. In some embodiments, the EMC layer 110 is omitted. The radiating element 106 and the antenna ground 108 of the antenna structure 104 in the integrated device package 8 can be disposed on the molding material 112. The radiating element 106 can be laterally offset from the integrated device die 102, and can be disposed outside the electromagnetic shield (e.g., the shielded region 119). In some embodiments, the antenna ground 108 and the conductive wires 118 can provide shielding for the integrated device die 102. The antenna ground 108 can comprise a continuous layer as shown in FIG. 9E.

Figure 9F:
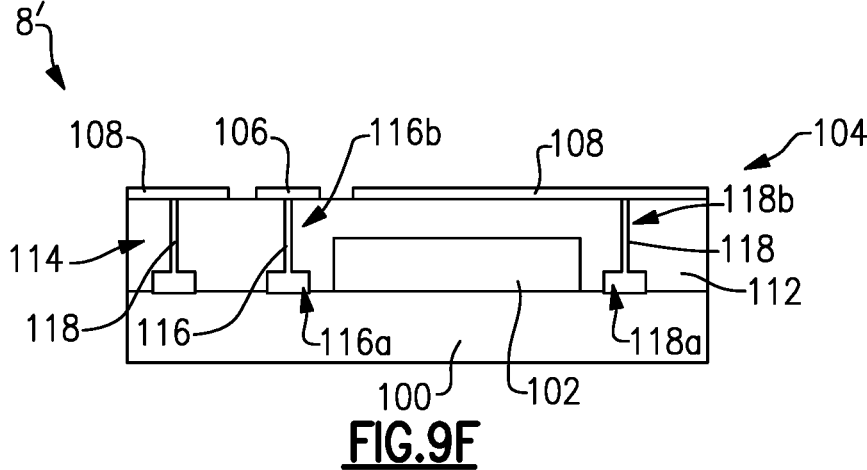
FIG. 9F is a schematic cross sectional side view of the integrated device package according to another embodiment.

FIG. 9F is a cross sectional side view of the integrated device package 8' according to an embodiment. Unless otherwise noted, the components of FIG. 9F may be the same as or generally similar to like components of FIGS. 9A to 9E. The antenna ground 108 can comprise one or more openings through a sheet of conductive material, or a plurality of portions that are spaced apart by a gap. In FIG. 9F, for example, the radiating element 106 and the ground element(s) (e.g., antenna ground 108) are disposed atop the molding material 112. The radiating element 106 can be positioned within the opening or gap between portions of the antenna ground 108. In FIG. 9F, therefore, the wires 116 connected to the radiating element 106 can be disposed within the shielded region 119.

Figure 9G:
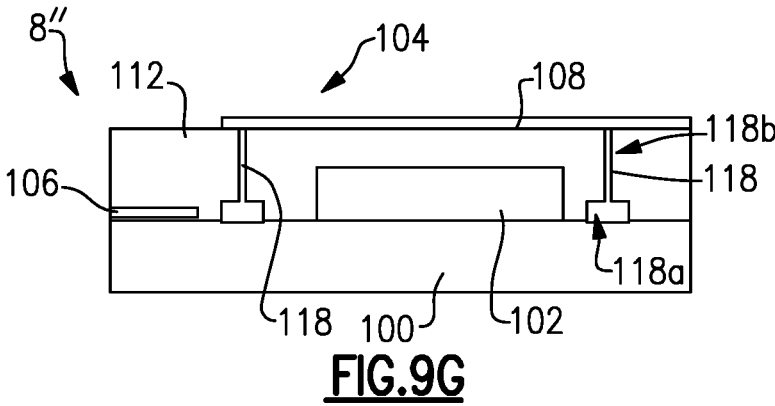
FIG. 9G is a schematic cross sectional side view of the integrated device package according to another embodiment.

FIG. 9G is a cross sectional side view of the integrated device package 8" according to an embodiment. Unless otherwise noted, the components of FIG. 9G may be the same as or generally similar to like components of FIGS. 9A to 9F. Unlike the radiating element 106 of the integrated device packages 8, 8' that is disposed on the molding material 112, the radiating element 106 of the integrated device package 8" is disposed on a portion of the carrier 100. In various embodiments, the radiating element 106 can be deposited or patterned in the carrier 100, adhered to the carrier 100, or otherwise provided on the carrier 100. The conductive wire 116 can be omitted from the integrated device package 8". In some embodiments, the radiating element 106 can be at least partially embedded in the molding material 112. For example, the radiating element 106 can be fully embedded in the molding material 112. In some embodiments, the carrier 100 can include conductive traces that extend laterally to provide electrical communication between the die 102 and the wires 118 or the radiating element 106.

Although FIGS. 9A-9G, depict integrated device packages 7, 7', 8, 8', 8" that includes one ground layer (e.g., the antenna ground 108) and one antenna layer (e.g., the radiating element 106), two or more layers ground layers and/or two or more antenna layers may be formed. Although a separate RDL layer is not shown, it is assumed that metallization is achieved by redistribution layer formation or any suitable technique may be used to form those metal layers for antenna and ground.

The integrated device die disclosed herein (e.g., the integrated device die 22, 102) can be bonded to a carrier (e.g., the redistribution layer 30 or carrier 100) in any suitable manner. In some embodiments, the integrated device die disclosed herein (e.g., the integrated device die 22) can be directly bonded to a carrier (e.g., the redistribution layer 30) without an intervening adhesive. Bonding surfaces of the integrated device die and the redistribution layer 30 can be prepared for direct bonding prior to contacting the surfaces. In some embodiments, a nonconductive region (e.g., a semiconductor or an inorganic dielectric) of the integrated device die can be directly bonded to a nonconductive region (e.g., a semiconductor or an inorganic dielectric) of the redistribution layer 30, and a conductive feature of the integrated device die can be directly bonded to a conductive feature of the carrier.

In one aspect, an integrated device package is disclosed. The integrated device package can include a system board that has an antenna structure, a redistribution layer that has conductive routing traces, and an integrated device die that is disposed between the system board and the redistribution layer. The integrated device die is electrically coupled to the antenna structure at least partially through one or more of the conductive routing traces of the redistribution layer.

In one embodiment, the system board includes a printed circuit board (PCB).

In one embodiment, the antenna structure includes a patch antenna and an antenna ground between the patch antenna and the integrated device die. The patch antenna can be exposed on a surface of the system board and the antenna ground is embedded in the system board.

In one embodiment, the system board is electrically coupled by the redistribution layer through an interconnect structure. The interconnect structure can include a conductive wire. The interconnect structure can include a bond via array (BVA). At least a portion of the BVA can define a radiation shield. The interconnect structure can include a conductive post. The integrated device package can further include a molding material that is disposed between the system board and the redistribution layer. The integrated device die can be at least partially embedded in the molding material. The interconnect structure can be at least partially embedded in the molding material.

In one embodiment, the integrated device die is attached to the system board by way of a die attach material.

In one embodiment, the integrated device die includes radio-frequency (RF) circuitry.

In one embodiment, the integrated device die is electrically connected to the redistribution layer through a conductive wire.

In one embodiment, the integrated device die is directly bonded to the redistribution layer without an intervening adhesive. A nonconductive region of the integrated device die can be directly bonded to a nonconductive region of the redistribution layer, and a conductive feature of the integrated device die can be directly bonded to a conductive feature of the redistribution layer.

In one aspect, an integrated device package is disclosed. The integrated device package can include an element that has an antenna structure, a redistribution layer that has conductive routing traces, and an integrated device die that is at least partially embedded in a molding material and disposed between the element and the redistribution layer. The integrated device die is electrically coupled to the antenna structure at least partially through one or more of the conductive routing traces of the redistribution layer. The redistribution layer is electrically coupled to the element through an interconnect structure comprising one or more conductive wires or posts formed through the molding material.

In one embodiment, the element includes a printed circuit board (PCB).

In one embodiment, the antenna structure includes an antenna and an antenna ground between the antenna and the integrated device die. The antenna can be exposed on a surface of the element and the antenna ground is embedded in the element.

In one embodiment, the interconnect structure includes the one or more of conductive wires of a bond via array (BVA).

In one embodiment, the integrated device die includes radio-frequency (RF) circuitry.

In one embodiment, solder balls are disposed on a surface of the integrated device die that faces away the element.

In one aspect, a method of manufacturing an integrated device package is disclosed. The method includes providing an element having an antenna structure. The element has a first side and a second side opposite the first side. The method can include mounting an integrated device die to the second side of the element, forming an interconnect structure extending from the second side, and providing a molding material around the integrated device die. The interconnect structure is at least partially embedded in the molding material. The method can include electrically coupling the antenna structure and a redistribution layer through the interconnect structure.

In one embodiment, the element includes a printed circuit board (PCB).

In one embodiment, the interconnect structure includes a bond via array or a conductive post.

In one embodiment, the integrated device die is disposed between the element and the redistribution layer.

In one embodiment, the antenna structure is formed on the first side of the element.

In one embodiment, the antenna structure is at least partially embedded in the element.

In one aspect, an integrated device package is disclosed. The integrated device package can include a system board that has an antenna structure, a redistribution layer that has conductive routing traces, and an integrated device die that is disposed between the system board and the redistribution layer. The integrated device die is electrically coupled to the redistribution layer.

In one embodiment, the integrated device die is at least partially embedded in a molding material.

In one embodiment, the system board and the redistribution are electrically connected through a bond via array (BVA).

In one embodiment, the integrated device die is a radio frequency (RF) die.

In one aspect, an integrated device package is disclosed. The integrated device package can include a system board, an antenna structure, a redistribution layer that has conductive routing traces, and an integrated device die that is disposed between the system board and the redistribution layer. The integrated device die is electrically coupled to the antenna structure at least partially through one or more of the conductive routing traces of the redistribution layer.

In one embodiment, the system board includes a printed circuit board (PCB).

In one embodiment, the antenna structure is formed with the system board.

In one embodiment, the system board and the redistribution are electrically connected through a bond via array (BVA).

In one embodiment, the integrated device die is a radio frequency (RF) die.

In one aspect, an integrated device package is disclosed. The integrated device package can include an antenna structure, a carrier that includes one or more routing traces and electrically coupled to the antenna structure through a conductive wire of an interconnect structure, and an integrated device die that is attached to the carrier and disposed between the carrier and at least a portion of the antenna structure. The integrated device die is electrically coupled to the antenna structure at least partially through the one or more of conductive routing traces of the carrier and the conductive wire.

In one embodiment, the integrated device die is attached to the carrier with an adhesive.

In one embodiment, the conductive wire includes a first portion in contact with the carrier and a second portion extending non-parallel to a surface of the carrier to which the integrated device die is mounted. The first portion can have a width wider than a width of the second portion indicative of a bond wire formation. The first portion and the second portion of the conductive wire can include a seamless uniform structure.

In one embodiment, the interconnect structure includes an array of standing bond wires. The array of standing bond wires can be arranged to at least partially form an electromagnetic shield region configured to shield the integrated device die. The array of standing bond wires can include a plurality of ground wires that are arranged with a pitch narrower than an operating frequency of the antenna structure.

In one embodiment, the integrated device package further includes an electromagnetic compatible layer comprising the antenna structure. The electromagnetic compatible layer can include a redistribution layer that includes one or more of traces that extend laterally. The electromagnetic compatible layer can further include a second antenna structure that is electrically connected to the one or more of traces. The electromagnetic compatible layer can include polyimide or polybenzoxazoles.

In one embodiment, the carrier includes a printed circuit board (PCB).

In one embodiment, the antenna structure includes a radiating element and an antenna ground. The antenna ground can be disposed between the radiating element and the integrated device die. The antenna ground can be formed on a first side of an electromagnetic compatible layer and the radiating element can be formed on a second side of the electromagnetic compatible layer opposite the first side. The electromagnetic compatible layer can include a via at least partially through a thickness of the electromagnetic compatible layer that electrically couples the conductive wire and the electromagnetic compatible layer. The via can include a filled via or a conformal via. The antenna ground can include a shielding layer that is configured to shield the integrated device die from a radio frequency. The radiating element can be exposed on a surface of the integrated device package. The antenna ground can be exposed on a surface of the integrated device package. The antenna ground can be formed on the carrier.

In one embodiment, the integrated device package further includes a molding material that is disposed between the carrier and the portion of the antenna structure. The integrated device die can be at least partially embedded in the molding material. The interconnect structure can be at least partially embedded in the molding material. The antenna structure can be formed on a surface of the molding material.

In one embodiment, the integrated device die is flip-chip mounted to the carrier.

In one embodiment, the integrated device die includes radio-frequency (RF) circuitry.

In one aspect, an integrated device package is disclosed. The integrated device package can include an electromagnetic compatible layer that has an antenna structure, a carrier that has one or more routing traces that are electrically coupled to the antenna structure through a conductive wire of an interconnect structure, and an integrated device die that is mounted on the carrier and disposed between the carrier and the electromagnetic compatible layer. The integrated device die is electrically coupled to the antenna structure at least partially through the conductive wire.

In one embodiment, the interconnect structure can include an array of standing bond wires. The array of standing bond wires can be arranged to shield the integrated device die from a radio frequency. The array of standing bond wires can be formed with a pitch narrower than an operating frequency of the antenna structure.

In one embodiment, the antenna structure includes a radiating element and an antenna ground. The antenna ground can be formed on a first side of the electromagnetic compatible layer and the radiating element can be formed on a second side of the electromagnetic compatible layer opposite the first side. The electromagnetic compatible layer can include a via at least partially through a thickness of the electromagnetic compatible layer that electrically couples the conductive wire and the radiating element. The via can include a filled via or a conformal via.

In one aspect, an integrated device package is disclosed. The integrated device package can include an antenna structure. The integrated device package can include a carrier that includes one or more of routing traces and is electrically coupled to the antenna structure through a conductive wire of an interconnect structure. The integrated device package can include an integrated device die that is mounted on the carrier and disposed between the carrier and at least a portion of the antenna structure. The integrated device die is electrically coupled to the antenna structure at least partially through the conductive wire. The integrated device package includes a molding material that is disposed between the carrier and the portion of the antenna structure. The integrated device die is at least partially embedded in the molding material. The interconnect structure is at least partially embedded in the molding material. The portion of the antenna structure is formed on a surface of the molding material.

In one embodiment, the interconnect structure includes an array of standing bond wires. The array of standing bond wires can be arranged to shield the integrated device die from a radio frequency. The array of standing bond wires can be formed with a pitch narrower than an operating frequency of the antenna structure so as to shield the integrated device die from the radio frequency having the operating frequency.

In one embodiment, the antenna structure comprises a radiating element and an antenna ground, the radiating element is formed on a portion of a surface of the molding material. The antenna ground can be formed on a second portion of the surface of the molding material. The antenna ground can be formed on a surface of the carrier.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An integrated device package comprising:
   a system board;
   an antenna structure at least partially embedded in the system board;
   a redistribution layer having conductive routing traces; and
   an integrated device die disposed between the system board and the redistribution layer, the system board and the redistribution layer being disposed at opposite sides of the integrated device die, the integrated device die electrically coupled to the antenna structure at least partially through one or more of the conductive routing traces of the redistribution layer.

2. The integrated device package of claim 1, wherein the system board comprises a printed circuit board (PCB).

3. The integrated device package of claim 1, wherein the system board and the redistribution are electrically connected through a bond via array (BVA).

4. The integrated device package of claim 1, wherein the integrated device die is a radio frequency (RF) die.

5. The integrated device package of claim 1, wherein the integrated device die is bonded to the system board by way of a die attach material.

6. The integrated device package of claim 1, wherein the integrated device die is directly bonded to redistribution layer.

7. An integrated device package comprising:
   an antenna structure;

17 a carrier comprising one or more routing traces and electrically coupled to the antenna structure through a standing bond wire of an interconnect structure;

an integrated device die attached to the carrier and disposed between the carrier and at least a portion of the antenna structure, the integrated device die electrically coupled to the antenna structure at least partially through the one or more routing traces of the carrier and the standing bond wire; and wherein the standing bond wire comprises a first portion in contact with the carrier and a second portion extending non-parallel to a surface of the carrier to which the integrated device die is mounted, the first portion having a first width wider than a second width of the second portion.

8. The integrated device package of claim 7, wherein the integrated device die is attached to the carrier with an adhesive.

9. The integrated device package of claim 7, wherein the first portion and the second portion of the standing bond wire comprises a seamless uniform structure.

10. The integrated device package of claim 7, wherein the interconnect structure comprises an array of standing bond wires.

11. The integrated device package of claim 10, wherein the array of standing bond wires is arranged to at least partially form an electromagnetic shield region configured to shield the integrated device die, the array of standing bond wires comprises a plurality of ground wires that are arranged with a pitch narrower than an operating frequency of the antenna structure.

12. The integrated device package of claim 7, further comprising an electromagnetic compatible layer comprising the antenna structure.

13. The integrated device package of claim 12, wherein the electromagnetic compatible layer comprises a redistribution layer that includes one or more of traces that extend laterally.

14. The integrated device package of claim 12, wherein the electromagnetic compatible layer comprises polyimide or polybenzoxazoles.

15. The integrated device package of claim 7, wherein the carrier comprises a printed circuit board (PCB).

16. The integrated device package of claim 7, wherein the antenna structure comprises a radiating element and an antenna ground.

17. The integrated device package of claim 16, wherein the antenna ground is disposed between the radiating element and the integrated device die.

18. The integrated device package of claim 17, wherein the antenna ground is formed on a first side of an electromagnetic compatible layer and the radiating element is formed on a second side of the electromagnetic compatible layer opposite the first side.

19. The integrated device package of claim 18, wherein the electromagnetic compatible layer comprises a via at least partially through a thickness of the electromagnetic compatible layer that electrically couples the standing bond wire and the electromagnetic compatible layer.

20. The integrated device package of claim 7, further comprising a molding material disposed between the carrier and the portion of the antenna structure, the integrated device die is at least partially embedded in the molding material, the interconnect structure is at least partially embedded in the molding material, the antenna structure is formed on a surface of the molding material.

21. An integrated device package comprising:

an antenna structure;

a carrier comprising one or more of routing traces and electrically coupled to the antenna structure through a standing bond wire of an interconnect structure;

an integrated device die mounted on the carrier and disposed between the carrier and at least a portion of the antenna structure, the integrated device die electrically coupled to the antenna structure at least partially through the standing bond wire; and a molding material disposed between the carrier and the portion of the antenna structure, the integrated device die at least partially embedded in the molding material, the interconnect structure at least partially embedded in the molding material, wherein the portion of the antenna structure is formed on a surface of the molding material, and the standing bond wire comprises a first portion in contact with the carrier and a second portion extending non-parallel to a surface of the carrier to which the integrated device die is mounted, the first portion having a first width wider than a second width of the second portion.

22. The integrated device package of claim 21, wherein the interconnect structure comprises an array of standing bond wires, the array of standing bond wires is arranged to shield the integrated device die from a radio frequency.

23. The integrated device package of claim 22, wherein the array of standing bond wires is formed with a pitch narrower than an operating frequency of the antenna structure so as to shield the integrated device die from the radio frequency having the operating frequency.

24. The integrated device package of claim 21, wherein the antenna structure comprises a radiating element and an antenna ground, the radiating element is formed on a portion of a surface of the molding material.

25. The integrated device package of claim 24, wherein the antenna ground is formed on a second portion of the surface of the molding material.

26. The integrated device package of claim 24, wherein the antenna ground is formed on a surface of the carrier.

* * * * *